United States Patent
Son et al.

(10) Patent No.: US 11,751,447 B2
(45) Date of Patent: Sep. 5, 2023

(54) DISPLAY APPARATUS

(71) Applicant: Samsung Display Co., Ltd., Yongin-Si (KR)

(72) Inventors: Donghyun Son, Yongin-si (KR); Hwajeong Kim, Yongin-si (KR); Kiho Bang, Yongin-si (KR); Dongwon Kim, Yongin-si (KR); Jingoo Jung, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 208 days.

(21) Appl. No.: 17/177,054

(22) Filed: Feb. 16, 2021

(65) Prior Publication Data

US 2021/0265451 A1  Aug. 26, 2021

(30) Foreign Application Priority Data

Feb. 25, 2020 (KR) .......................... 10-2020-0023006

(51) Int. Cl.
*H10K 59/131* (2023.01)
(52) U.S. Cl.
CPC .................................. *H10K 59/131* (2023.02)
(58) Field of Classification Search
CPC ............. H01L 27/3276; H01L 27/3272; H01L 27/1225; H01L 27/124; H01L 51/52; H10K 59/131; H10K 59/126; H10K 50/80

See application file for complete search history.

(56) References Cited

U.S. PATENT DOCUMENTS

| | | | |
|---|---|---|---|
| 8,008,665 B2 | 8/2011 | Yang et al. | |
| 9,280,947 B2 | 3/2016 | Kim et al. | |
| 10,254,578 B2 | 4/2019 | Shin et al. | |
| 2017/0068135 A1* | 3/2017 | Jung | G02F 1/13439 |
| 2017/0115542 A1* | 4/2017 | Oh | G02F 1/136286 |
| 2018/0166037 A1 | 6/2018 | Lee et al. | |
| 2019/0121207 A1 | 4/2019 | Xian et al. | |
| 2019/0206976 A1 | 7/2019 | Jeong et al. | |
| 2021/0013287 A1 | 1/2021 | Bang et al. | |

FOREIGN PATENT DOCUMENTS

| | | |
|---|---|---|
| EP | 3680710 A1 | 7/2020 |
| EP | 3748682 A1 | 12/2020 |
| KR | 10-1249984 B1 | 4/2013 |
| KR | 10-2017-0042421 A | 4/2017 |
| KR | 10-2018-0066342 A | 6/2018 |
| KR | 10-1903568 B1 | 10/2018 |
| KR | 10-2019-0083392 A | 7/2019 |

* cited by examiner

*Primary Examiner* — Adam R. Giesy
(74) *Attorney, Agent, or Firm* — Innovation Counsel LLP

(57) ABSTRACT

A display apparatus may include the following elements: a substrate including a display area and a peripheral area outside the display area; first data lines lengthwise in a first direction and arranged on the display area; first wires arranged on the display area; and a driving circuit arranged on the peripheral area and electrically connected through the first wires to the first data lines. Branches may protrude from bodies of the first wires. Two branches among the branches may protrude toward each other. End edges of the two branches may be spaced apart in a second direction different from the first direction.

20 Claims, 21 Drawing Sheets

DISPLAY APPARATUS

CROSS-REFERENCE TO RELATED APPLICATION

This application claims priority to and the benefit of Korean Patent Application No. 10-2020-0023006 filed on Feb. 25, 2020 in the Korean Intellectual Property Office; the Korean Patent Application is incorporated herein by reference.

BACKGROUND

1. Field

The technical field relates to a display apparatus.

2. Description of Related Art

A display apparatus may include a display area for displaying images according to input signals and may include a peripheral area abutting the display area. Preferably, the peripheral area should be minimized, and the display area should be maximized.

SUMMARY

Embodiments may be related to a display apparatus in which patterned wires in a display area are invisible or inconspicuous.

Embodiments may be related a display apparatus in which a peripheral area is minimized.

According to one or more embodiments, a display apparatus includes a substrate including a display area and a peripheral area outside the display area, first data lines extending in a first direction and arranged in the display area, and first wires arranged in the display area and connected to the first data lines to transmit a data signal from a driving circuit arranged in the peripheral area to the first data lines, wherein each of the first wires includes a branches protruding from the first wire, wherein ends of a pair of branches protruding toward each other from two adjacent first wires from among the first wires are spaced apart in a second direction crossing the first direction.

The first wires may include a first portion, a third portion, and a second portion between the first portion and the third portion, wherein the second portion may extend in the second direction.

Each of the first wires may include first branches protruding from the first portion and the third portion and second branches protruding from the second portion.

Ends of a pair of first branches protruding toward each other from the two adjacent first wires from among the first wires may be spaced apart in the second direction.

Ends of a pair of second branches protruding toward each other from the two adjacent first wires from among the first wires may be spaced apart in the second direction.

The ends of the pair of first branches spaced apart in the second direction and the ends of the pair of second branches spaced apart in the second direction may be arranged on the same axis.

The display apparatus may further include second data lines arranged in the display area, and second wires and third wires arranged in the peripheral area.

Each of the first wires may include one end connected to the first data lines and the other end connected to the second wires.

The first wires and the first data lines may be arranged on different layers from each other.

The third wires may be connected to the second data lines, respectively.

The third wires and the second data lines may be arranged on different layers from each other.

The display apparatus may further include a fourth wires arranged in the display area, wherein the fourth wires may be electrically separated from the first wires.

Each of the fourth wires may include third branches protruding from the fourth wire, wherein ends of a pair of third branches protruding toward each other from two adjacent fourth wires from among the fourth wires may be spaced apart in the second direction.

According to one or more embodiments, a display apparatus includes a substrate including a display area and a peripheral area outside the display area, first data lines extending in a first direction and arranged in the display area, and first wires arranged in the display area and connected to the first data lines to transmit a data signal from a driving circuit arranged in the peripheral area to the first data lines, wherein each of the first wires includes branches protruding from the first wire, wherein ends of each of the branches include a diagonal shape inclined in a diagonal direction of the first direction and a second direction crossing the first direction.

Directions in which ends of the branches are inclined may be the same as each other.

The first wires may include a first portion, a third portion, and a second portion between the first portion and the third portion, wherein the second portion may extend in the second direction.

Each of the first wires may include first branches protruding from the first portion and the third portion and second branches protruding from the second portion, and ends of each of the first branches and the second branches may include the diagonal shape inclined in the diagonal direction.

Ends of a pair of first branches protruding toward each other from two adjacent first wires from among the first wires may be spaced apart in the second direction.

Ends of a pair of second branches protruding toward each other from the two adjacent first wires from among the first wires may be spaced apart in the first direction.

The ends of the pair of first branches spaced apart in the second direction and the ends of the pair of second branches spaced apart in the first direction may be arranged on the same axis. An embodiment may be related to a display apparatus. The display apparatus may include the following elements: a substrate including a display area and a peripheral area outside the display area; first data lines lengthwise in a first direction and arranged on the display area; first wires arranged on the display area; and a driving circuit arranged on the peripheral area and electrically connected through the first wires to the first data lines. Branches may protrude from bodies of the first wires. Two branches among the branches may protrude toward each other. End edges of the two branches may be spaced apart in a second direction different from the first direction and may be shorter than sides of the two branches.

The second direction may be perpendicular to the first direction.

The end edges of the two branches may be parallel to each other.

The sides of the two branches may be lengthwise sides of the two branches.

The sides of the two branches may be parallel sides of the two branches.

First sections of the first wires may be connected through second sections of the first wires, respectively, to the third sections of the first wires, respectively. The second sections of the first wires may be lengthwise in the second direction, may be not aligned with the first sections of the first wires, and may be not aligned with the third sections of the first wires.

First branches may protrude from the first sections of the first wires and from the third sections of the first wires. Second branches may protrude from the second sections of the first wires.

Two first branches among the first branches may protrude toward each other. End edges of the two first branches may be spaced apart in the second direction and may be shorter than sides of the two first branches.

End edges of two second branches among the second branches may be spaced apart in the second direction and may be shorter than sides of the two second branches.

The end edges of the two first branches may be respectively aligned with the end edges of the two second branches.

The display apparatus may include the following elements: second data lines arranged on the display area; second wires arranged on the peripheral area and electrically isolated from the second data lines; and third wires arranged on the peripheral area and electrically isolated from the second wires.

The second wires may be electrically connected through the first wires, respectively, to the first data lines, respectively.

The display apparatus may include an insulating layer. A face of the insulating layer may directly contact the first wires and may be spaced from the first data lines.

The third wires may be electrically connected to the second data lines, respectively.

The display apparatus may include an insulating layer. A face of the insulating layer may directly contact the third wires and may be spaced from the second data lines.

The display apparatus may include fourth wires arranged on the display area. The fourth wires may be electrically isolated from the first wires.

The display apparatus may include an insulating layer. A face of the insulating layer may directly contact the first wires and may directly contact the fourth wires.

Third branches may protrude from bodies of the fourth wires. End edges of two third branches among the third branches may be spaced apart in the second direction and may be shorter than sides of the two third branches.

An embodiment may be related to a display apparatus. The display apparatus may include the following elements: a substrate including a display area and a peripheral area outside the display area; first data lines lengthwise in a first direction and arranged on the display area; a first wires arranged on the display area; and a driving circuit arranged on the peripheral area and electrically connected through the first wires to the first data lines. Branches may protrude from bodies of the first wires. End edges of the branches may be oblique relative to the first direction and may be shorter than sides of the branches.

The sides of the two branches may be lengthwise sides of the two branches.

The sides of the two branches may be parallel sides of the two branches.

The end edges of the branches may be parallel to each other.

First sections of the first wires may be connected through second sections of the first wires, respectively, to the third sections of the first wires, respectively. The second sections of the first wires may be lengthwise in a second direction different from the first direction, may be not aligned with the first sections of the first wires, and may be not aligned with the third sections of the first wires.

The second direction may be perpendicular to the first direction.

First branches may protrude from the first sections of the first wires and from the third sections of the first wires. Second branches may protrude from the second sections of the first wires. End edges of the first branches may be oblique relative to the first direction and may be shorter than sides of the first branches. End edges of the second branches may be oblique relative to the first direction and may be shorter than sides of the second branches.

Two first branches among the first branches may protrude toward each other. End edges of the two first branches may be spaced apart in the second direction.

Two second branches among the second branches may protrude toward each other. End edges of the two second branches may be spaced apart in the first direction.

A gap between the end edges of the two first branches may be aligned with a gap between the end edges of the two second branches in the first direction.

DETAILED DESCRIPTION

Figure 1:
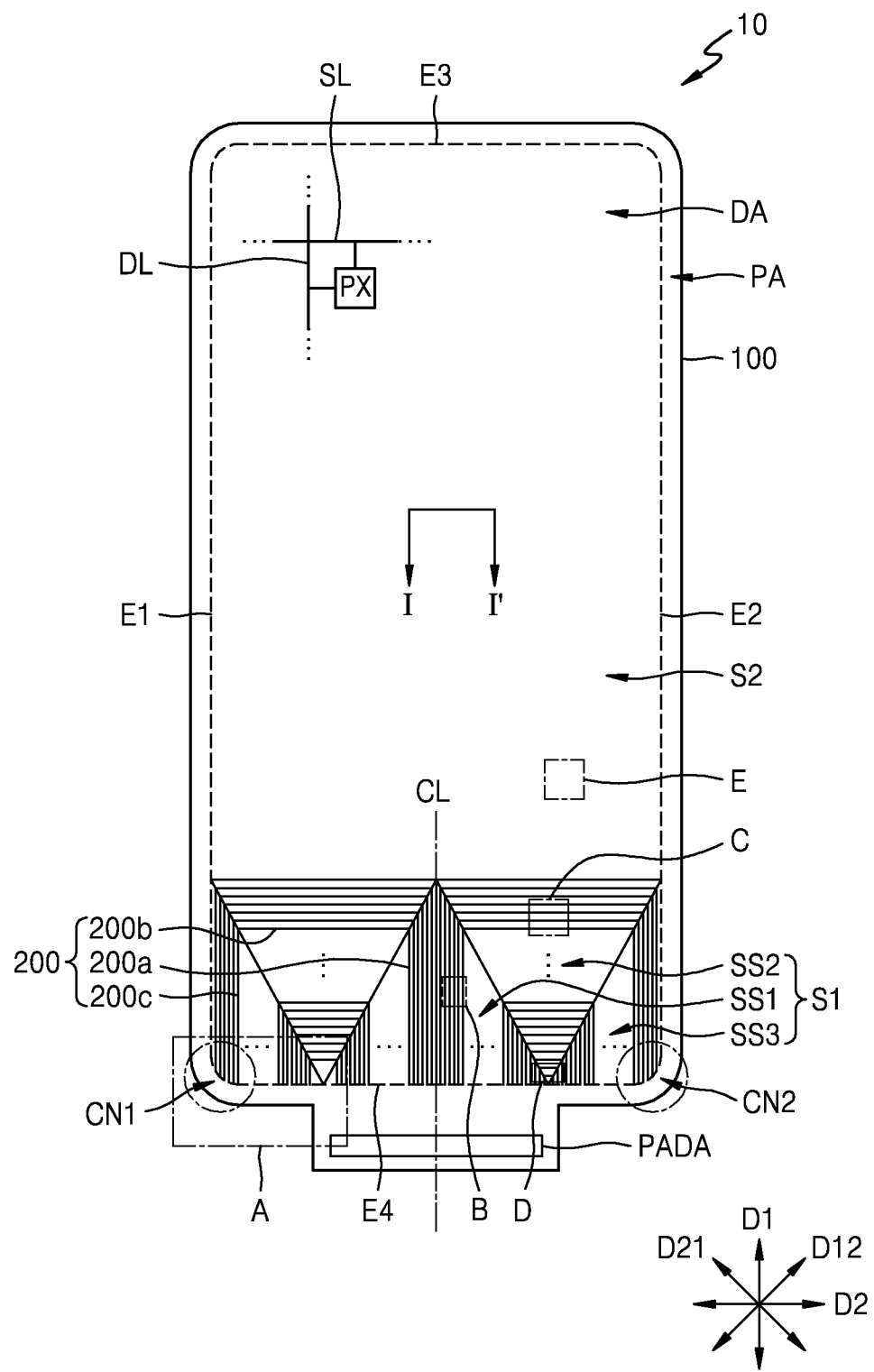
FIG. 1 is a schematic plan view of a display panel according to an embodiment.

Example embodiments are described with reference the accompanying drawings, wherein like reference numerals may refer to like elements. Practical embodiments may have different forms and should not be construed as being limited to the described embodiments.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

The singular forms "a," "an," and "the" may also mean plural forms unless the context clearly indicates otherwise.

The terms "include," "comprise," and "have" may specify the presence of stated features or components but may not preclude the presence or addition of one or more other features or components.

When a first element is referred to as being "on" a second element, the first element can be directly on the second element, or one or more intervening elements may be present between the first element and the second element. When a first element is referred to as being "directly on" a second element, no intervening elements (except environmental elements such as air) may be intended or required between the first element and the second element.

Dimensions in the drawings may be exaggerated or reduced for convenience of explanation.

When an element (e.g., a wire set) is described as "lengthwise in a first direction" or "extending in a first direction," the lengthwise direction of the element (e.g., the wire set) is in the first direction. An extension direction of an element may mean the lengthwise direction of the element.

The term "connect" may mean "electrically connect" or "electrically connected through no intervening transistor." The term "insulate" may mean "electrically insulate" or "electrically isolate." The term "drive" may mean "control" or "operate." The term "portion" may mean "section." The term "pattern" may mean "member." The term "end" may mean "end segment" or "end edge." A display panel may be a display apparatus or a module/part of a display apparatus.

Figure 2:
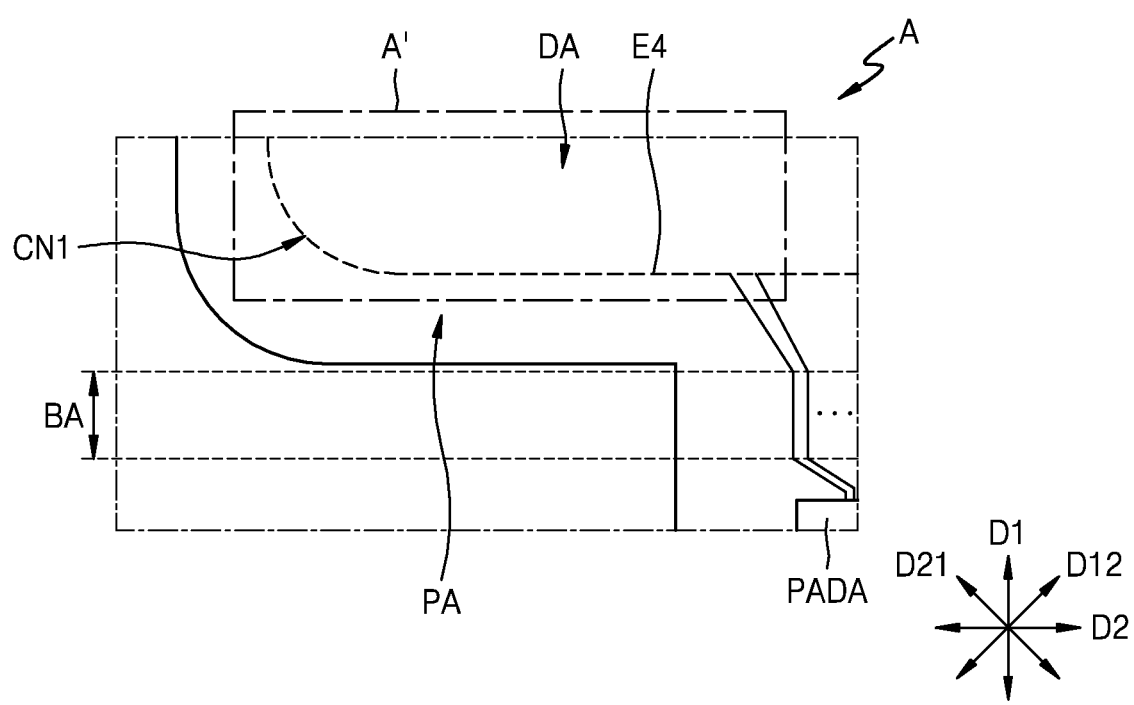
FIG. 2 is a schematic conceptual diagram of region A of FIG. 1 according to an embodiment.
Figure 3:
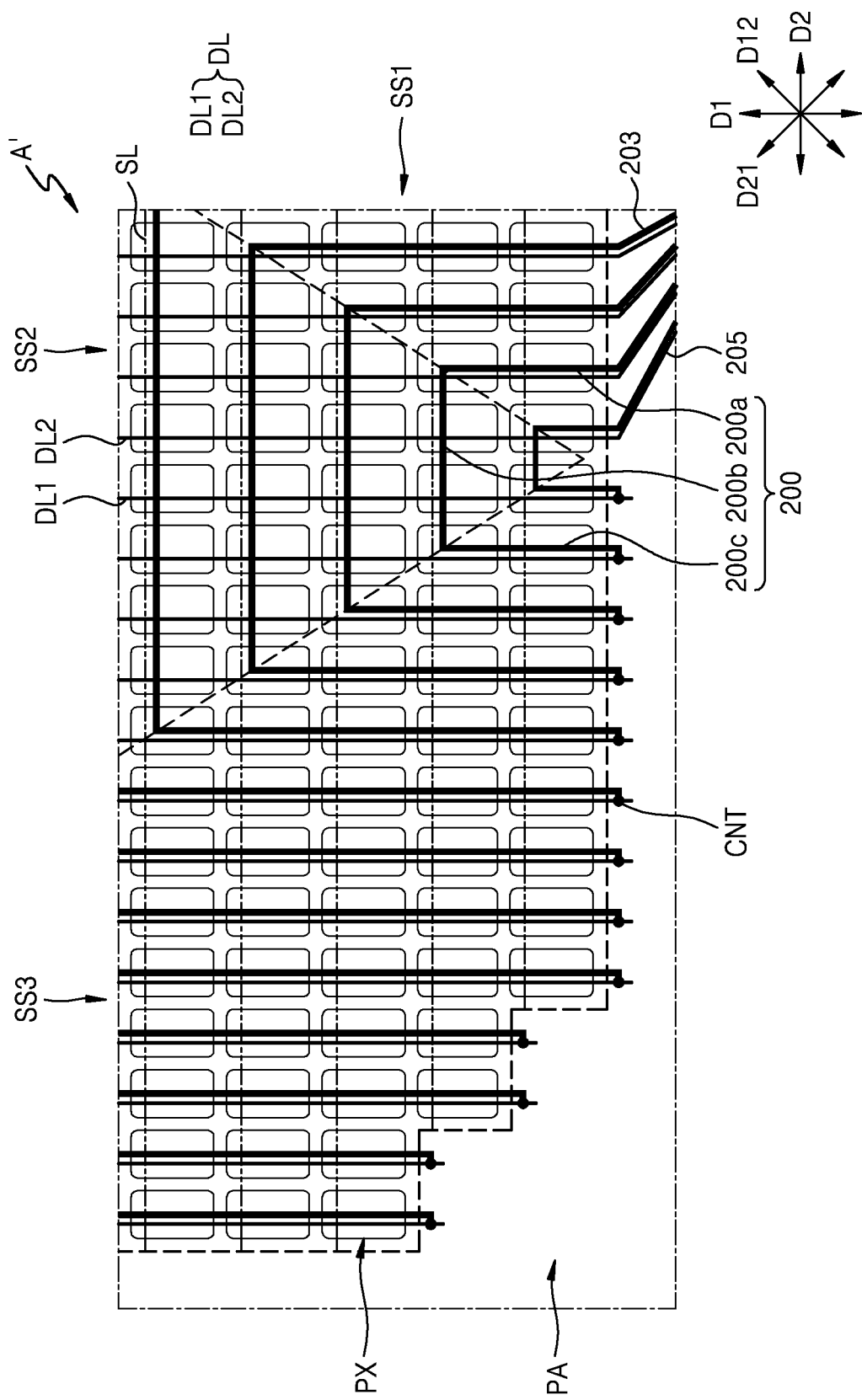
FIG. 3 is an enlarged plan view of region A' of FIG. 2 according to an embodiment.

FIG. 1 is a schematic plan view of a display panel 10 according to an embodiment. The display panel 10 may be a display apparatus or part of a display apparatus. FIG. 2 is a schematic conceptual diagram of region A of FIG. 1 according to an embodiment. FIG. 3 is an enlarged plan view of region A' of FIG. 2 according to an embodiment.

Referring to FIG. 1, the display panel 10 may include a substrate 100. The display panel 10 may have a display area DA for display images according to input signals and may have a peripheral area PA located outside and/or abutting the display area DA. The substrate 100 may have a display area DA and a peripheral area PA corresponding to the display area DA and the peripheral area PA of the display panel 10.

In the plan view, the boundary of the display area DA may substantially have a rectangle shape or a square shape. As illustrated in FIGS. 1 and 2, a first corner CN1 of the boundary of the display area DA may be substantially curved. The display area DA may include a first edge E1 and a second edge E2 opposite each other, and may include a third edge E3 and a fourth edge E4 between the first edge E1 and the second edge E2 and opposite each other. A pad area PADA is adjacent to the fourth edge E4. The first corner CN1 may connect the first edge E1 to the fourth edge E4. A second corner CN2 of the boundary of the display area DA may also be substantially curved. The second corner CN2 may connect the second edge E2 to the fourth edge E4. Other portions of the boundary of the display area DA may also be curved.

The peripheral area PA may surround the display area DA. The peripheral area PA may include no pixels PX and may include the pad area PADA. The pad area PADA may support and/or include electronic components, a printed circuit board, and a voltage line configured to supply power for driving a display element. The pad area PADA may include pads, and the pads may be electrically connected to a data driver. The data driver may supply a data signal and may be arranged on a film electrically connected to the pads using Chip On Film (COF) technology. The data driver may be directly arranged on the substrate 100 using Chip On Glass (COG) or Chip On Plastic (COP) technology.

FIG. 1 may illustrate a state of the substrate 100 during a manufacturing process of a display apparatus. In an electronic apparatus that includes the display apparatus/panel 10, a portion of the substrate 100 may be bent, to reduce a footprint of the peripheral area PA.

As illustrated in FIG. 2, the peripheral area PA may include a bending area BA, and the bending area BA may be between the pad area PADA and the display area DA. The substrate 100 may be bent at the bending area BA to allow the pad area PADA to overlap the display area DA and to be located behind the display area DA without covering the image displaying surface of the display area DA. Accordingly, the user may perceive a minimum peripheral area PA (surrounding the display area DA).

FIG. 3 shows a region/portion A' of the display apparatus/panel 10 including the first corner CN1. The display apparatus/panel 10 and/or an electronic apparatus including the display apparatus/panel 10 may have curved/rounded corners as observed by a user in ordinary use. However, in a significantly enlarged view/image of the portion A', as illustrated in FIG. 3, the first corner CN1 may include straight sections that extend in a first direction D1 and may include straight sections that extend in a second direction D2 different from (and perpendicular to) the first direction D1.

Pixels PX and signal lines for applying electrical signals to the pixels PX may be located in the display area DA.

Each of the pixels PX may include a display element and a pixel circuit for driving the display element. As an example, the display element may be an organic light-emitting diode, and the pixel circuit may include thin film transistors and a storage capacitor. The pixels PX may include first pixels emitting light of a first color, second pixels emitting light of a second color, and third pixels emitting light of a third color. For example, a first pixel may be a red pixel (R), a second pixel may be a green pixel (G), and a third pixel may be a blue pixel (B).

The signal lines for applying electrical signals to the pixels PX may include scan lines SL and data lines DL. Each of the data lines DL may extend in the first direction D1, and each of the scan lines SL may extend in the second direction D2. The scan lines SL may respectively transmit scan signals to rows of the pixels PX, and the data lines DL may be, respectively transmit data signals to columns of the pixels PX. Each of the pixels PX may be connected to at least one corresponding scan line SL among the scan lines SL and a corresponding data line DL among the data lines DL. As illustrated in FIG. 3, the data lines DL may include first data lines DL1 and second data lines DL2. The first data lines DL1 may be data lines connected to first wires 200. The second data lines DL2 may be data lines other than the first data lines DL1.

The first wires 200 may transmit electrical signals supplied from the pad area PADA to signal lines connected to the pixels PX and may be substantially arranged in the display area DA. For example, the first wires 200 may be connected to the first data lines DL1 to transmit data signals supplied from pads of the pad area PADA to the first data lines DL1. Each of the first wires 200 may be located in a layer different from the layers of the scan lines SL and the data lines DL.

Referring to FIG. 1, the first wires 200 arranged on a left side of a virtual (geometric) center line CL of the display panel 10 and the first wires 200 arranged on a right side of the center line CL may be substantially symmetrical with respect to the center line CL. The first wires 200 on the left side of the center line CL may be a mirror image of the first wires 200 on the right side of the center line CL.

Each of the first wires 200 may include a first portion 200a, a second portion 200b, and a third portion 200c. The second portion 200b may extend in the second direction D2 and may connect the first portion 200a to the third portion 200c. At least one of the first portion 200a and the third portion 200c may have a straight shape extending in the first direction D1, and/or may include sections extending in one or more of the first direction D1, the second direction D2, a diagonal direction D12, and a diagonal direction D21.

The first portion 200a, the second portion 200b, and the third portion 200c may be integrally formed. The first portion 200a may be arranged closer to the center line CL than the corresponding third portion 200c is, and the third portion 200c may be arranged closer to the corresponding one of the corners CN1 and CN2 than the correspond first portion 200a is. The first portion 200a may extend from the fourth edge E4 in a direction away from the pad area PADA. The second portion 200b may be bent from the first portion 200a to extend toward the first edge E1 or the second edge E2 in the second direction D2. The third portion 200c may be bent from the second portion 200b to extend back toward the fourth edge E4.

The display area DA may be divided into areas based on the arrangement of the first wires 200. For example, the display area DA may include a first area S1 in which the first wires 200 are arranged, and a second area S2 in which no first wires 200 are arranged.

The first area S1 may be divided into sub-areas according to locations of portions/sections of the first wires 200. For example, the first area S1 may include a first sub-area SS1 in which first portions 200a of the first wires 200 are arranged, a second sub-area SS2 in which second portions 200b are arranged, and a third sub-area SS3 in which third portions 200c are arranged. The first sub-area SS1, the second sub-area SS2, and the third sub-area SS3 located on the right side of the center line CL may respectively be mirror images of the first sub-area SS1, the second sub-area SS2, and the third sub-area SS3 located on the left side of the center line CL.

Referring to FIG. 3, the second portion 200b of each of the first wires 200 may be parallel to a corresponding scan line SL and may partially overlap or be positioned closer to the corresponding scan line SL than to other scan lines.

A pixel column overlapping a first portion 200a may be spaced from a pixel column overlapping the corresponding third portion 200c by at least one pixel column. The first portions 200a of a pair of immediately adjacent first wires 200 may be spaced apart from each other by a width of at least one pixel column. The third portions 200c of a pair of immediately adjacent first wires 200 may be spaced apart from each other by a width of at least one pixel column. The second portions 200b of a pair of immediately adjacent first wires 200 may be spaced apart from each other by a width of at least one pixel row.

As illustrated in FIG. 3, second wires 203 and third wires 205 may be arranged in the peripheral area PA.

Each of the first wires 200 may have one end connected to a first data line DL1 and the other end connected to a second wire 203. One end of the second wire 203 may be connected to the first wire 200, and the other end of the second wire 203 may be connected to a pad of the pad area PADA. In an embodiment, a second wire 203 may be a portion of a first portion 200a that extends to the peripheral area PA. In an embodiment, a second wire 203 may be a separate wire arranged in a layer different from the layer of a first wire 200 and may be electrically connected to the first portion 200a of the first wire 200 in the peripheral area PA. The third portion 200c of the first wire 200 may be electrically connected to the first data line DL1 in/through a contact portion/hole CNT in the peripheral area PA. In an embodiment, a third portion 200c of a first wire 200 may be electrically connected to the first data line DL1 in/through a contact portion/hole CNT in the display area DA.

A third wire 205 may have one end connected to a second data line DL2 and the other end connected to a pad of the pad area PADA. In an embodiment, a third wire 205 may be a portion of a second data line DL2 that extends to the peripheral area PA. In an embodiment, a third wire 205 may be a separate wire arranged in a layer different from the layer of a second data line DL2 and may be electrically connected to the second data line DL2 in the peripheral area PA and/or in the display area DA.

Figure 4:
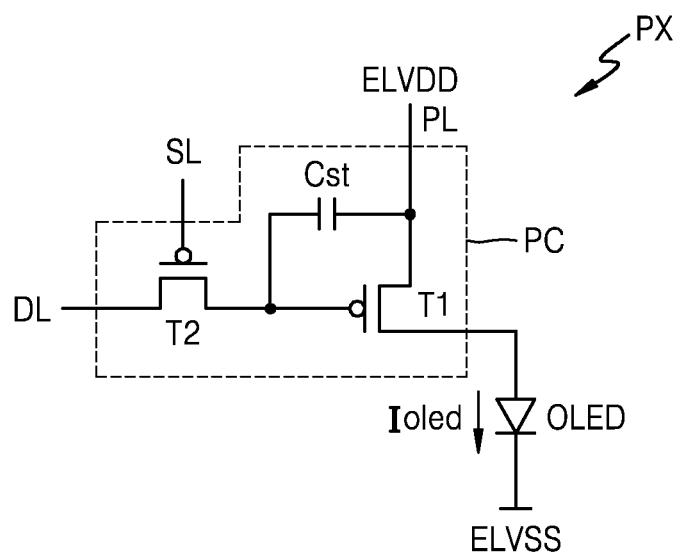
FIG. 4 is an equivalent circuit diagram of a pixel included in a display panel according to an embodiment.
Figure 5:
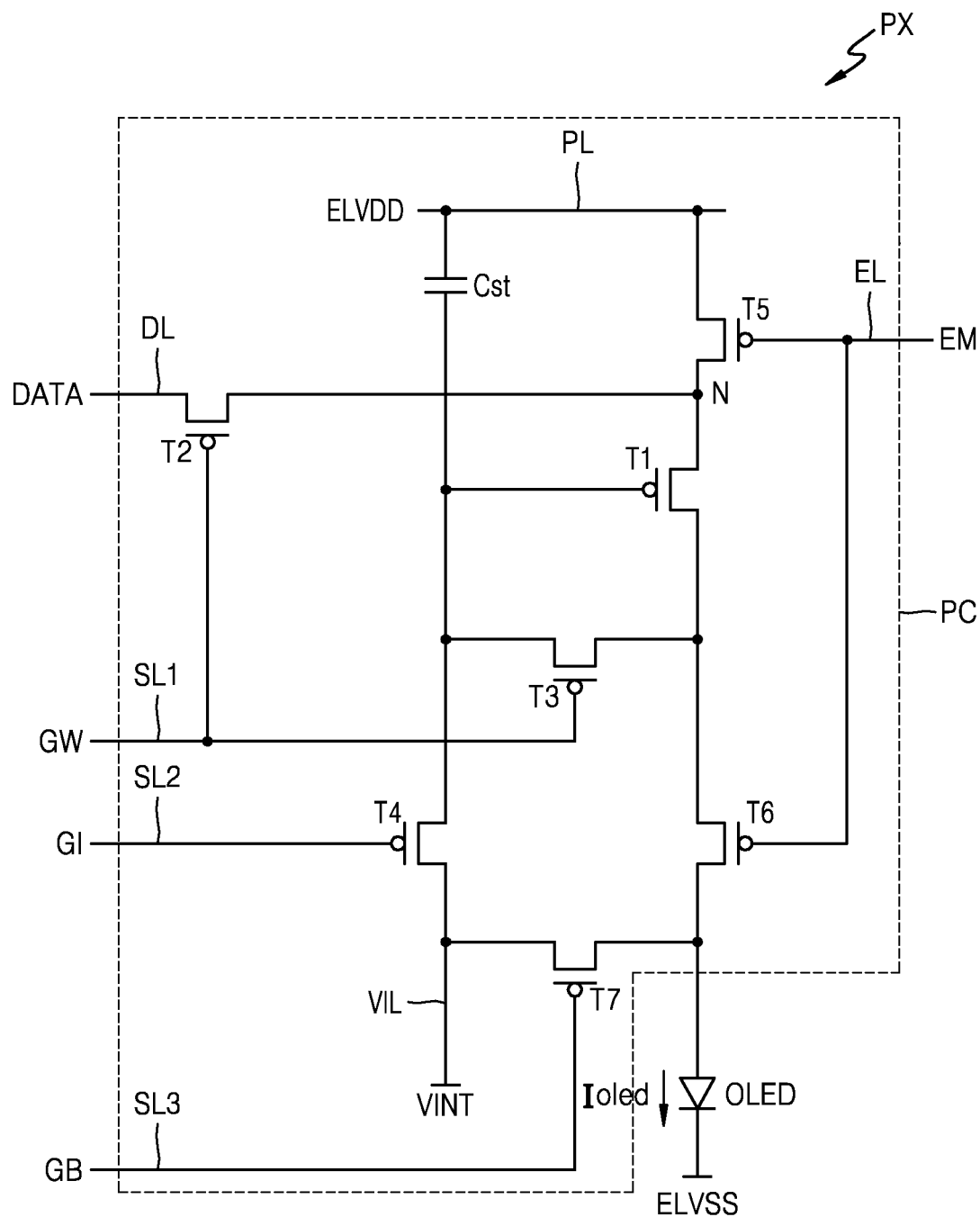
FIG. 5 is an equivalent circuit diagram of a pixel included in a display panel according to an embodiment.

Each of FIGS. 4 and 5 illustrates an equivalent circuit diagram of a pixel PX included in a display panel according to an embodiment.

Referring to FIG. 4, the pixel PX includes a pixel circuit PC and an organic light-emitting diode OLED, which is a display element connected to the pixel circuit PC. The pixel circuit PC may include a first thin film transistor T1, a second thin film transistor T2, and a storage capacitor Cst. The pixel PX may emit, for example, red, green, blue, or white light, through the organic light-emitting diode OLED.

The second thin film transistor T2, which is a switching thin film transistor, may be connected to the scan line SL and the data line DL and may be configured to transmit a data signal input from the data line DL to the first thin film transistor T1 according to a switching voltage input from the scan line SL. The storage capacitor Cst may be connected to the second thin film transistor T2 and a power voltage line PL and may store a voltage corresponding to a difference between a voltage corresponding to a data signal received from the second thin film transistor T2 and a first power voltage ELVDD supplied to the power voltage line PL. The power voltage line PL may be spaced apart from the scan line SL or the data line DL in parallel.

The first thin film transistor T1, which is a driving thin film transistor, may be connected to the power voltage line PL and the storage capacitor Cst and may control a driving current flowing through the organic light-emitting diode OLED from the power voltage line PL in response to a voltage value stored in the storage capacitor Cst. The organic light-emitting diode OLED may include a pixel electrode and an opposite electrode, and the opposite electrode may receive a second power voltage ELVSS. The organic light-emitting diode OLED receives a driving current IDLED from the first thin film transistor T1 and emits light, thereby displaying an image.

FIG. 4 illustrates the pixel circuit PC including two thin film transistors and one storage capacitor. In another embodiment, the number of thin film transistors and the number of storage capacitors may be variously changed according to design of the pixel circuit PC.

Referring to FIG. 5, signal lines, for example, a first scan line SL1, a second scan line SL2, a third scan line SL3, an emission control line EL, and the data line DL, an initialization voltage line VIL, and the power voltage line PL are provided for each pixel PX. According to another embodiment, at least one of signal lines, for example, the first scan line SL1, the second scan line SL2, the third scan line SL3, the emission control line EL, and the data line DL, the initialization voltage line VIL and/or the power voltage line PL may be shared by neighboring pixels.

The signal lines include the first scan line SL1 configured to transmit a first scan signal GW, the second scan line SL2 configured to transmit a second scan signal GI, the third scan signal SL3 configured to transmit a third scan signal GB, the emission control line EL configured to transmit an emission control signal EM, and the data line DL configured to transmit a data signal DATA. The third scan line SL3 may be the second scan line SL2 of the next row, and the third scan signal GB may be the second scan signal GI of the next row.

The power voltage line PL is configured to transmit the first power voltage ELVDD to the first thin film transistor T1, and the initialization voltage line VIL is configured to transmit an initialization voltage VINT for initializing the first thin film transistor T1 and the organic light-emitting diode OLED to the pixel PX.

The first scan line SL1, the second scan line SL2, the third scan line SL3, the emission control line EL, and the initialization voltage line VIL may extend in the second direction D2 and may be spaced apart from one another in each row. The data line DL and the power voltage line PL may extend in the first direction D1 and may be spaced apart from each other in each column.

The pixel circuit PC of the pixel PX may include first to seventh transistors T1 to T7 and the storage capacitor Cst.

The first thin film transistor T1 is connected to the power voltage line PL via the fifth thin film transistor T5 and is electrically connected to the organic light-emitting diode OLED via the sixth thin film transistor T6. The first thin film transistor T1 serves as a driving thin film transistor, and receives the data signal DATA according to a switching operation of the second thin film transistor T2 to supply the driving current IDLED to the organic light-emitting diode OLED.

The second thin film transistor T2 is connected to the first scan line SL1 and the data line DL and is turned on according to the first scan signal GW received via the first scan line SL1 to perform a switching operation for transmitting the data signal DATA transmitted via the data line DL to a node N.

The third thin film transistor T3 is connected to the organic light-emitting diode OLED via the sixth thin film transistor T6. The third thin film transistor T3 is turned on according to the first scan signal GW received via the first scan line SL1 to diode-connect the first thin film transistor T1.

The fourth thin film transistor T4 is turned on according to the second scan signal GI received via the second scan line SL2 to initialize a gate voltage of the first thin film transistor T1 by transmitting the initialization voltage VINT from the initialization voltage line VIL to a gate electrode of the first thin film transistor T1.

The fifth thin film transistor T5 and the sixth thin film transistor T6 are simultaneously turned on according to the emission control signal EM received via the emission control line EL to form a current path so that the driving current IDLED may flow in a direction from the power voltage line PL to the organic light-emitting diode OLED.

The seventh thin film transistor T7 is turned on according to the third scan signal GB received via the third scan line SL3 to initialize the organic light-emitting diode OLED by transmitting the initialization voltage VINT from the initialization voltage line VIL to the organic light-emitting diode OLED. According to an embodiment, the seventh thin film transistor T7 may be omitted.

Although FIG. 5 illustrates the fourth thin film transistor T4 connected to the second scan line SL2 and the seventh thin film transistor T7 connected to the separate third scan line SL3, the disclosure is not limited thereto. According to another embodiment, the seventh thin film transistor T7 as well as the fourth thin film transistor T4 may be connected to the second scan line SL2.

The storage capacitor Cst may be connected to the power voltage line PL and the gate electrode of the first thin film transistor T1 and thus may store and maintain a voltage corresponding to a difference between voltages at both ends, thereby maintaining a voltage applied to the gate electrode of the first thin film transistor T1.

The organic light-emitting diode OLED may include a pixel electrode and an opposite electrode, and the opposite electrode may receive the second power voltage ELVSS. The organic light-emitting diode OLED receives the driving current IDLED from the first thin film transistor T1 and emits light, thereby displaying an image.

Figure 6:
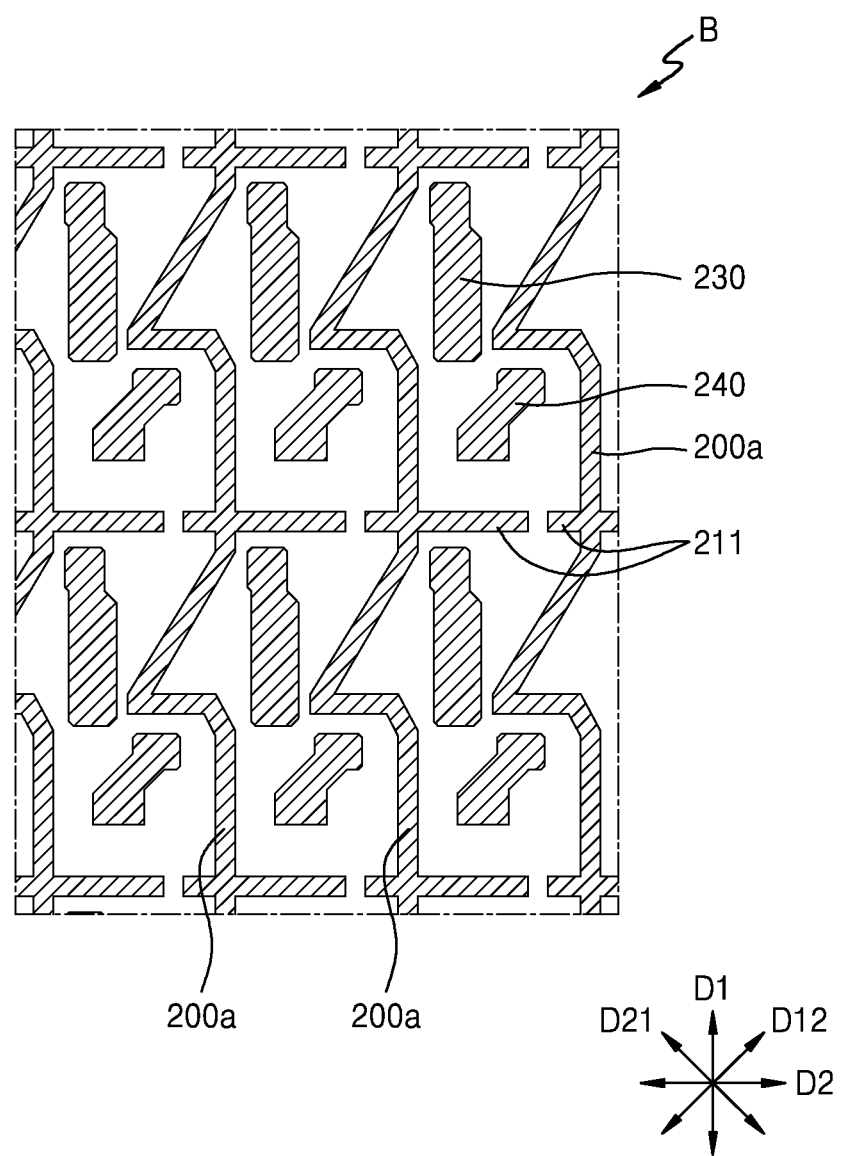
FIG. 6 illustrates a schematic plan view of a first wire in a display apparatus according to an embodiment.
Figure 7:
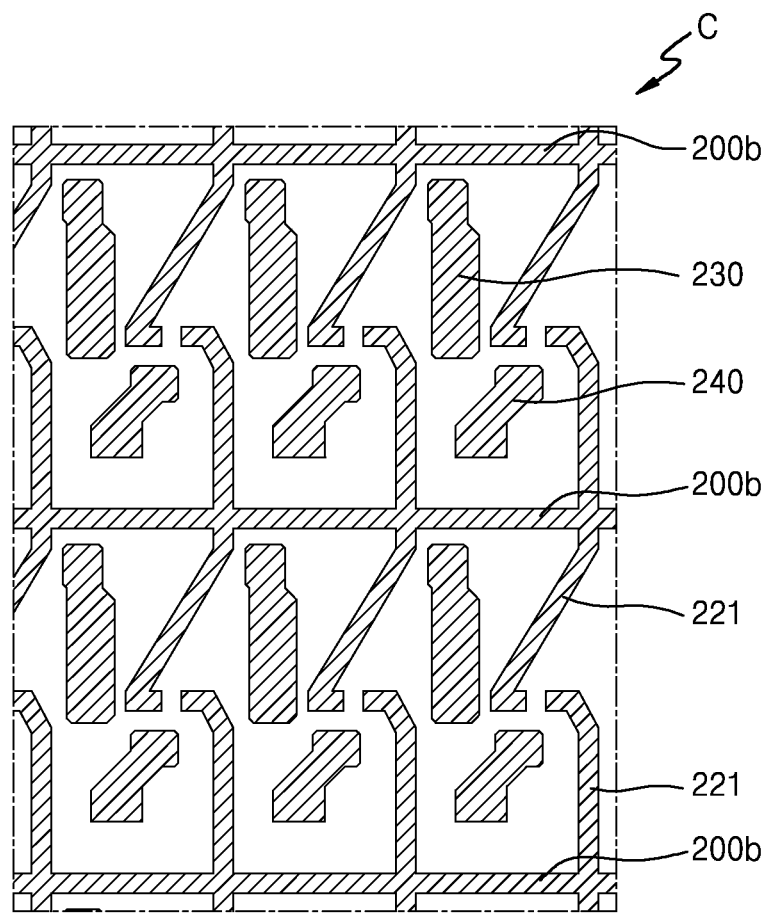
FIG. 7 illustrates a schematic plan view of a first wire in a display apparatus according to an embodiment.
Figure 7:
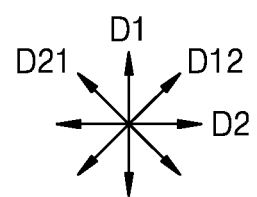
Figure 8:
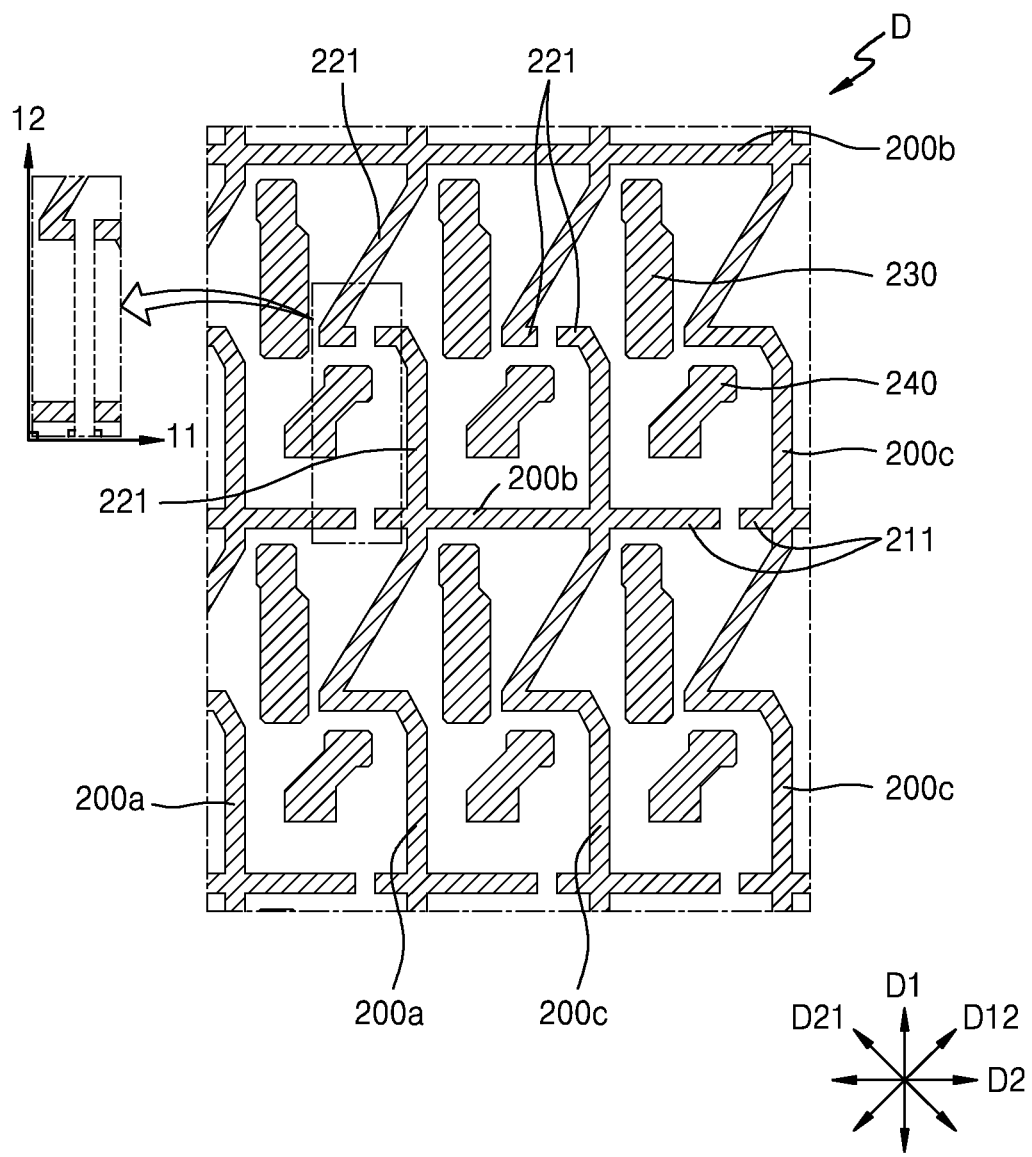
FIG. 8 illustrates a schematic plan view of a first wire in a display apparatus according to an embodiment.

Each of FIGS. 6 to 8 illustrates a schematic plan view of portions of first wires 200 in a display apparatus according to an embodiment. FIG. 6 is an enlarged plan view of region B of FIG. 1, FIG. 7 is an enlarged plan view of region C of FIG. 1, and FIG. 8 is an enlarged plan view of region D of FIG. 1.

FIGS. 6 to 8 illustrate structures of first wires 200 arranged on a right side of the center line CL, and the illustrated structures may apply analogously to first wires 200 arranged on a left side of the center line CL.

Referring to FIG. 6, in the first sub-area SS1, the first portion 200a of a first wire 200 may include first branches 211 protruding in the second direction D2. Although not illustrated, in the third sub-area SS3, the third portion 200c of a first wire 200 may include first branches 211 protruding in the second direction D2. Structures of the first branches 211 of the first portion 200a may be analogous or identical to the first branches 211 of the third portion 200c.

The first branches 211 of the first portion 200a may protrude from a body of the first portion 200a in opposite directions (e.g., left and right directions) along the second direction D2. Two first branches 211 protruding toward each other from bodies of two immediately adjacent first portions 200a may be aligned. Ends of the first branches 211 extending toward each other may be spaced from each other in the second direction D2 to form a gap. Gaps between the first branches 211 may be substantially aligned and/or substantially regularly spaced (at substantially constant intervals) in the first direction D1 and/or in the second direction D2.

Referring to FIG. 7, in the second sub-area SS2, the body of the second portion 200b of a first wire 200 may extend in the second direction D2, and the second portion 200b may include second branches 221 protruding from the body of the second portion 200b. The second branches 221 may include sections/segments extending in one or more of the first direction D1, the second direction D2, the diagonal direction D12, and the diagonal direction.

Two second branches 221 protruding toward each other from two immediately adjacent second portions 200b may include aligned sections/segments. Ends of the second branches 221 extending toward each other may be spaced from each other in the second direction D2 to form a gap.

Referring to FIG. 8, in a portion of the display area DA where the first sub-area SS1, the second sub-area SS2, and the third sub-area SS3 abut one another, the first portion 200a of a first wires 200 may be arranged in the first sub-area SS1, the second portion 200b of the first wire 200 may be arranged in the second sub-area SS2, and the third portion 200c of the first wire 200 may be arranged in the third sub-area SS3.

The first portion 200a of the first wire 200 may include first branches 211 extending in the second direction D2, the second portion 200b of the first wire 200 may include second branches 221, and the third portion 200c of the first wires 200 may include first branches 211 extending in the second direction D2. The second branches 221 may include sections/segments extending in one or more of the first direction D1, the second direction D2, the diagonal direction D12, and the diagonal direction D21.

End segments of two first branches 211 protruding toward each other from two immediately adjacent first wires 200 may be spaced in the second direction D2 and may be aligned in the second direction D2 along a first axis 11. End segments of two second branches 221 protruding toward each other from two immediately adjacent first wires 200 may be spaced apart in the second direction D2 and may be aligned in the second direction D2 along a first axis 11.

End edges of two first branches 211 facing each other may be respectively aligned with end edges of two second branches 221 facing each other in the first direction D1 along a second axis 12.

If the disconnection direction of the ends of the first branches 211 is different from the disconnection direction of the ends of the second branches 221, a significant difference in reflectance may occur. As a result, the first sub-area SS1, the second sub-area SS2, and the third sub-area SS3 may be undesirably visible to the user when external light is irradiated on the display panel 10.

To solve the above problem, a spacing direction of ends of the first branches 211 may be configured consistent with a spacing direction of ends of the second branches 221, and opposite end edges of first branches 211 may be aligned with opposite end edges of second branches 221. Accordingly, a difference of light reflected (or scattered) at the ends of the first branches 211 and the ends of the second branches 221 may be minimized. Advantageously, distinctions between the first sub-area SS1, the second sub-area SS2, and the third sub-area SS3 may be invisible or inconspicuous to the user.

Figure 9:
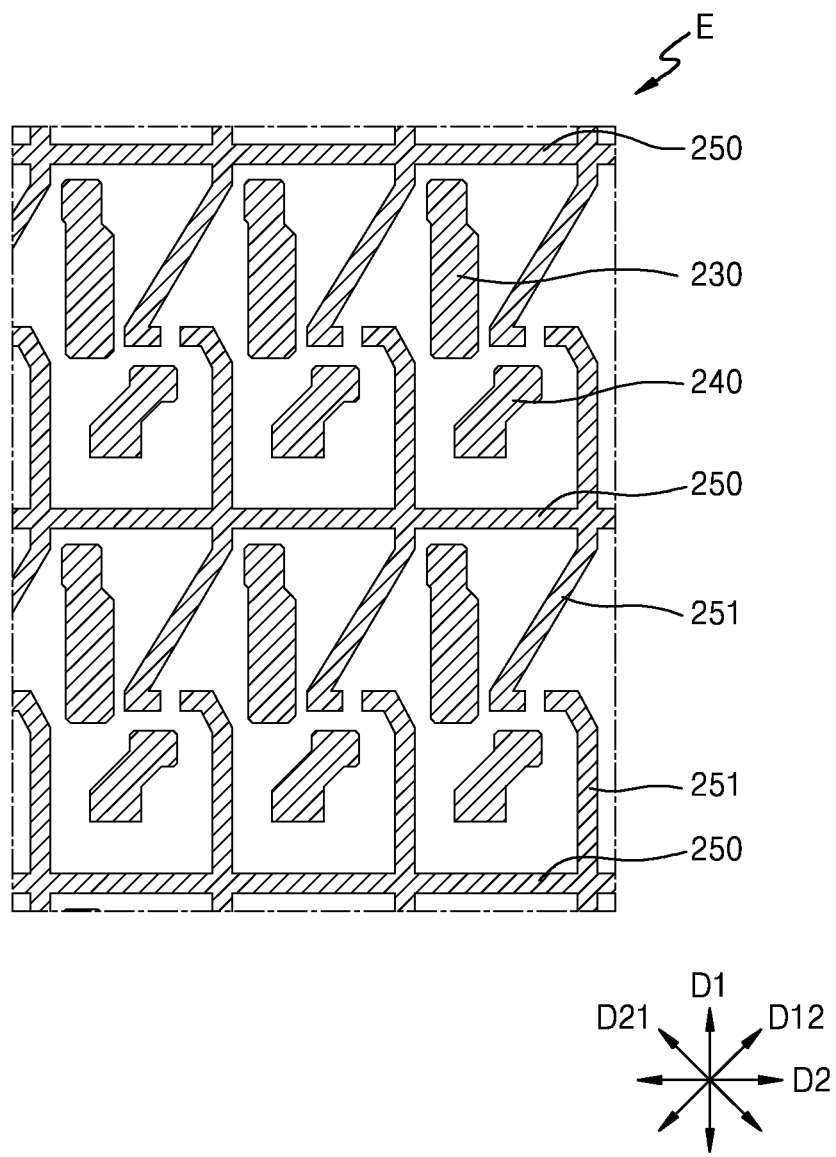
FIG. 9 illustrates a schematic plan view of a fourth wire in a display apparatus according to an embodiment.

FIG. 9 illustrates a schematic plan view of a fourth wire 250 in a display apparatus according to an embodiment. FIG. 9 is an enlarged plan view of region E of FIG. 1.

Fourth wires 250 may be arranged in the same layer as the first wires 200 and in a second area S2. The fourth wires 250 may include the same material as the first wires 200. The fourth wires 250 may be spaced apart from and electrically separated/isolated from the first wires 200. The fourth wires 250 extend in the second direction D2, and the fourth wires 250 may include third branches 251 protruding from bodies of the fourth wires 250. The third branches 251 may include sections/segments extending in one or more of the first direction D1, the second direction D2, the diagonal direction D12, and the diagonal direction D21.

Two third branches 251 protruding toward each other from two immediately adjacent fourth wires 250 may have aligned and spaced segments. To prevent disturbance/interference between the fourth wires 250, end segments of third branches 251 extending toward each may be spaced from each other in the second direction D2 with an intervening gap in a plan view of the display panel/apparatus 10. The fourth wires 250 may be connected to each other in the peripheral area PA. The fourth wires 250 may be integrally formed.

Referring to FIGS. 6 to 9, conductive patterns/members may be further arranged in the same layer as the first wires 200 and the fourth wires 250. The conductive patterns may include first patterns 230. A first pattern 230 may serve as a shielding electrode for preventing signal interference between a circuit element arranged on a first side of the first pattern 230 and a pixel electrode arranged on a second side of the first pattern 230. The first pattern 230 may be electrically connected to the power voltage line PL connected to the pixel PX and thus may receive the first power voltage ELVDD. The conductive patterns may include second patterns 240. The second pattern 240 may serve as a bridge electrode connecting a circuit element arranged on a first side of the second pattern 240 and a pixel electrode arranged on a second side of the second pattern 240 to each other.

The first patterns 230 may be physically and electrically separated from the first wires 200 and the fourth wires 250. Each of the first patterns 230 in the second area S2 may be connected to the third branches 251 of the fourth wires 250 by at least a bridge. In an embodiment, the fourth wires 250, the first patterns 230, and bridges arranged in the second area S2 may be integrally formed. The fourth wires 250 arranged in the second area S2 may receive the first power voltage ELVDD via one or more of the first pattern 230 from the power voltage line PL.

The fourth wires 250 arranged in the second area S2 extend in the second direction D2 and are spaced apart from each other. In an embodiment, the fourth wires 250 may have an interconnected grid structure.

Figure 10A:
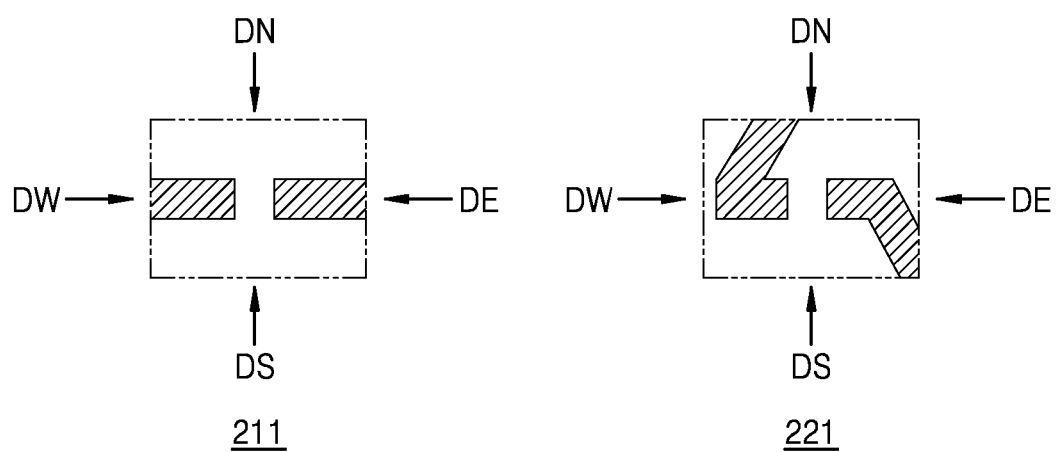
FIG. 10A is a schematic plan view of branches having ends spaced apart in the same direction according to an embodiment.
Figure 10A:
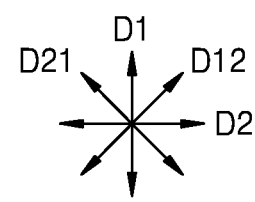
Figure 10B:
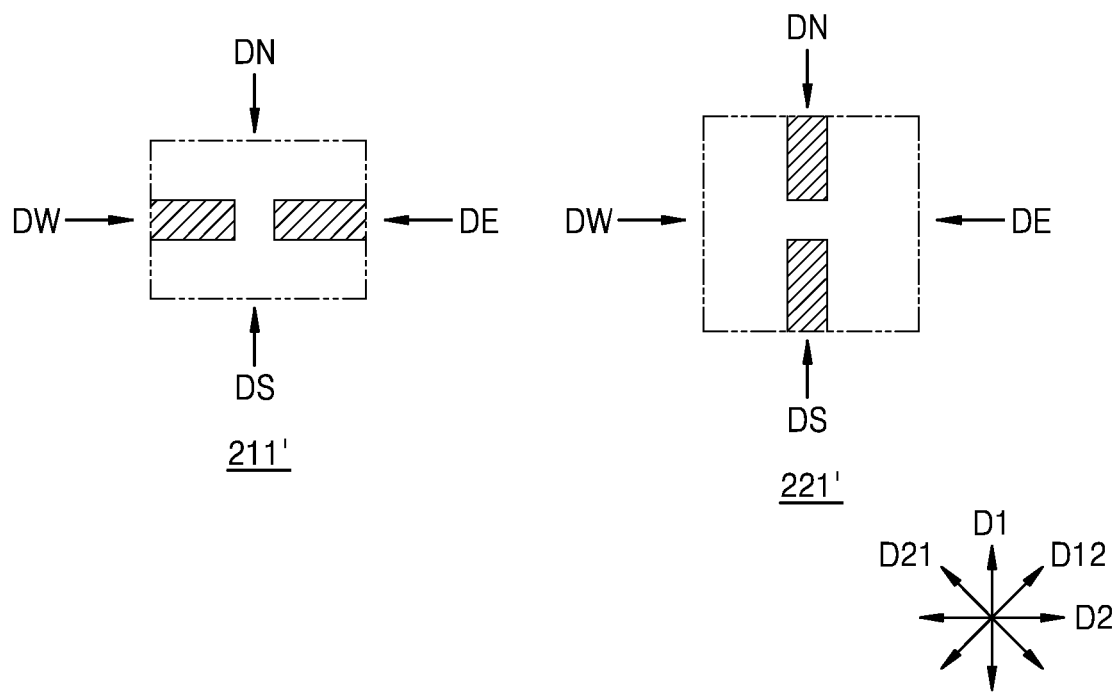
FIG. 10B is a schematic plan view of branches having ends spaced apart in different directions according to a comparative example.

FIG. 10A is a plan view of branches having end segments spaced apart in the same direction according to an embodiment. FIG. 10B is a plan view of branches having end segments spaced apart in different directions according to a comparative example.

Referring to FIG. 10B, ends of two first branches 211' are spaced apart in the second direction D2, and ends of two second branches 221' are spaced apart in the first direction D1. When a user looks at the first branch 211' and the second branch 221' at a slant (for example, at a 45-degree angle relative to a main surface of a substrate) in each of the east direction DE, west direction DW, south direction DS, and north direction DN, a difference in reflectance may be caused by light reflected (or scattered) from an end surface of a first branch 211' and light reflected (or scattered) from an end surface of a second branch 221'. In the comparative example, numbers/densities of end surfaces visible in each direction may be different for different wire portions; thus, the first sub-area SS1, the second sub-area SS2, and the third sub-area SS3 may be undesirably visible.

Referring to FIG. 10A, opposite end segments of the first branches 211 and opposite end segments of the second branches 221 are spaced apart in the same direction. Therefore, when a user looks at the first branch 211 and the second branch 221 at a slant (for example, at a 45-degree angle relative to a main surface of a substrate) in each of the east direction DE, west direction DW, south direction DS, and north direction DN, no significant difference in reflectance may be caused by light reflected (or scattered) from an end surface of a first branch 211 and light reflected (or scattered) from an end surface of a second branch 221. As a result, reflection (or scattering) characteristics of light may be substantially uniform in the first area S1. Advantageously, distinctions between the first sub-area SS1, the second sub-area SS2, and the third sub-area SS3 may be desirably invisible or inconspicuous.

Figure 11:
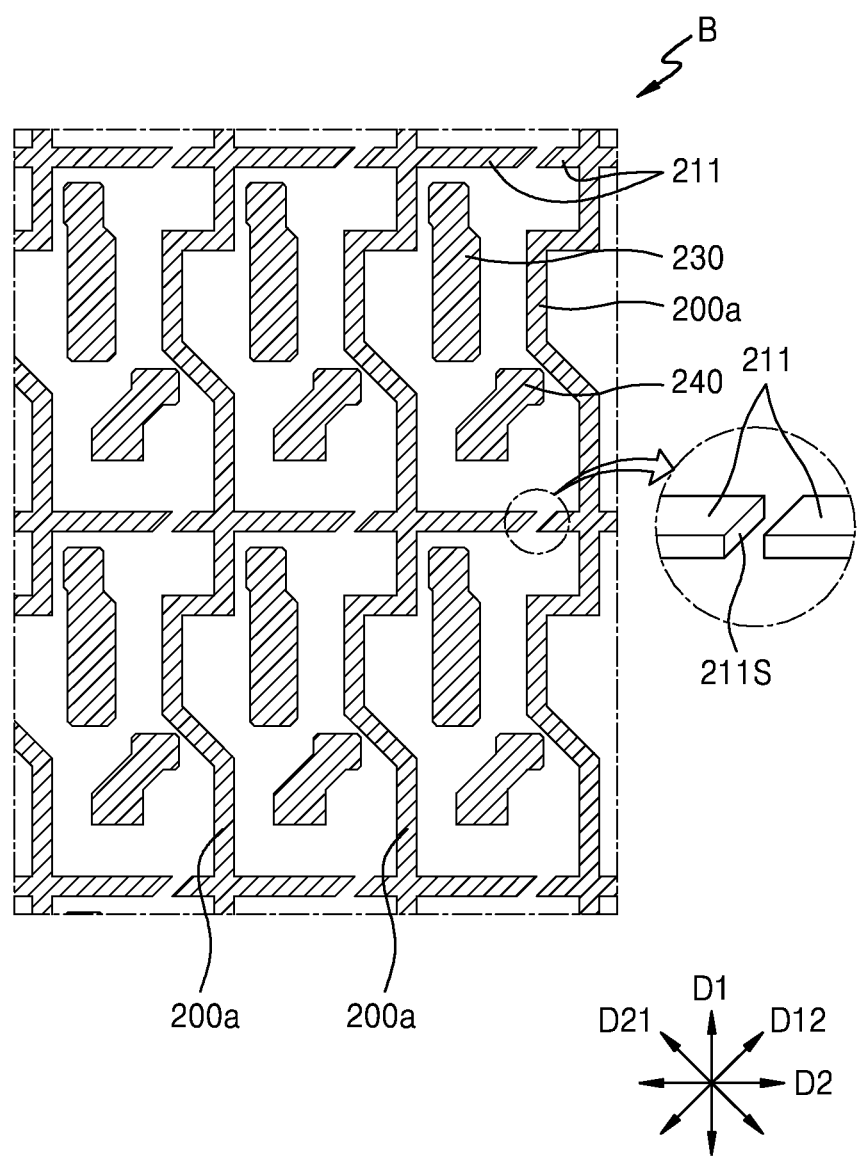
FIG. 11 illustrates a schematic plan view of a first wire in a display apparatus according to an embodiment.
Figure 12:
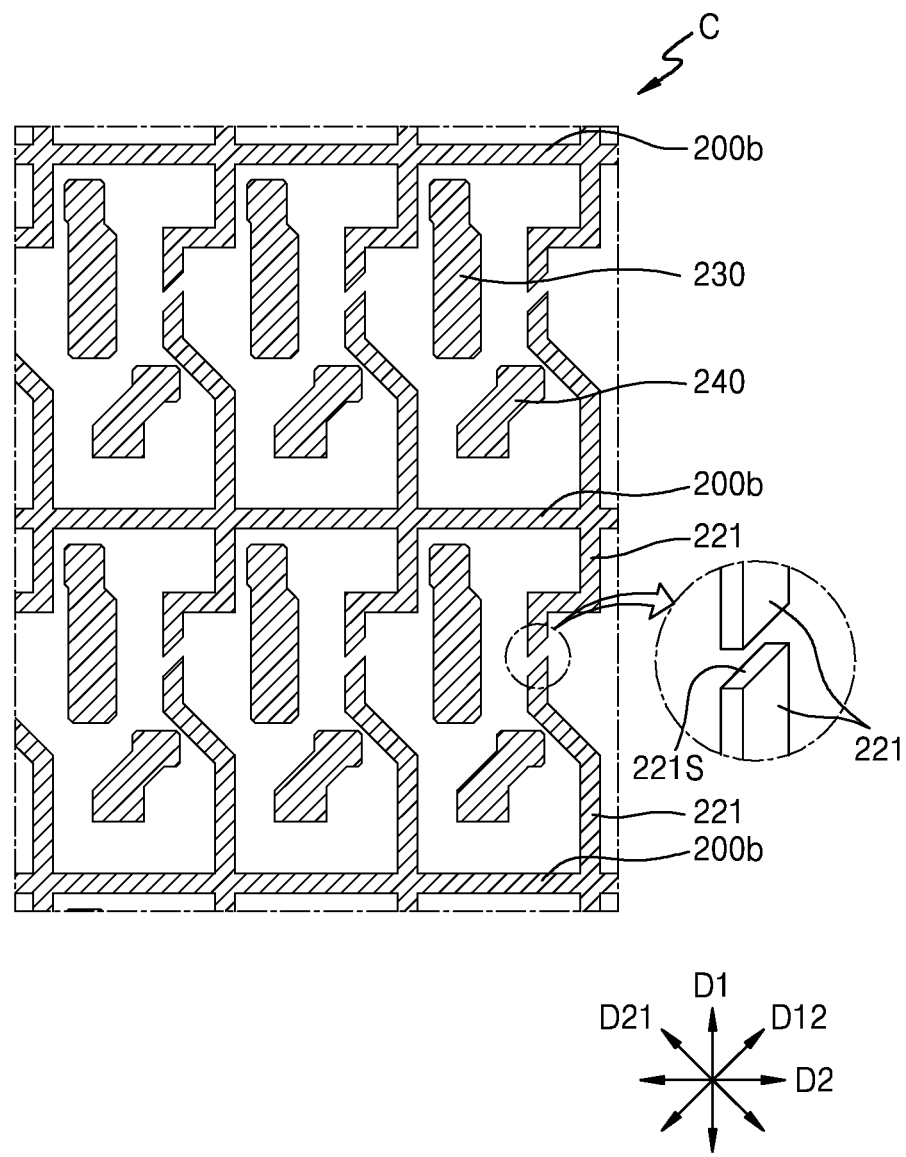
FIG. 12 illustrates a schematic plan view of a first wire in a display apparatus according to an embodiment.
Figure 13:
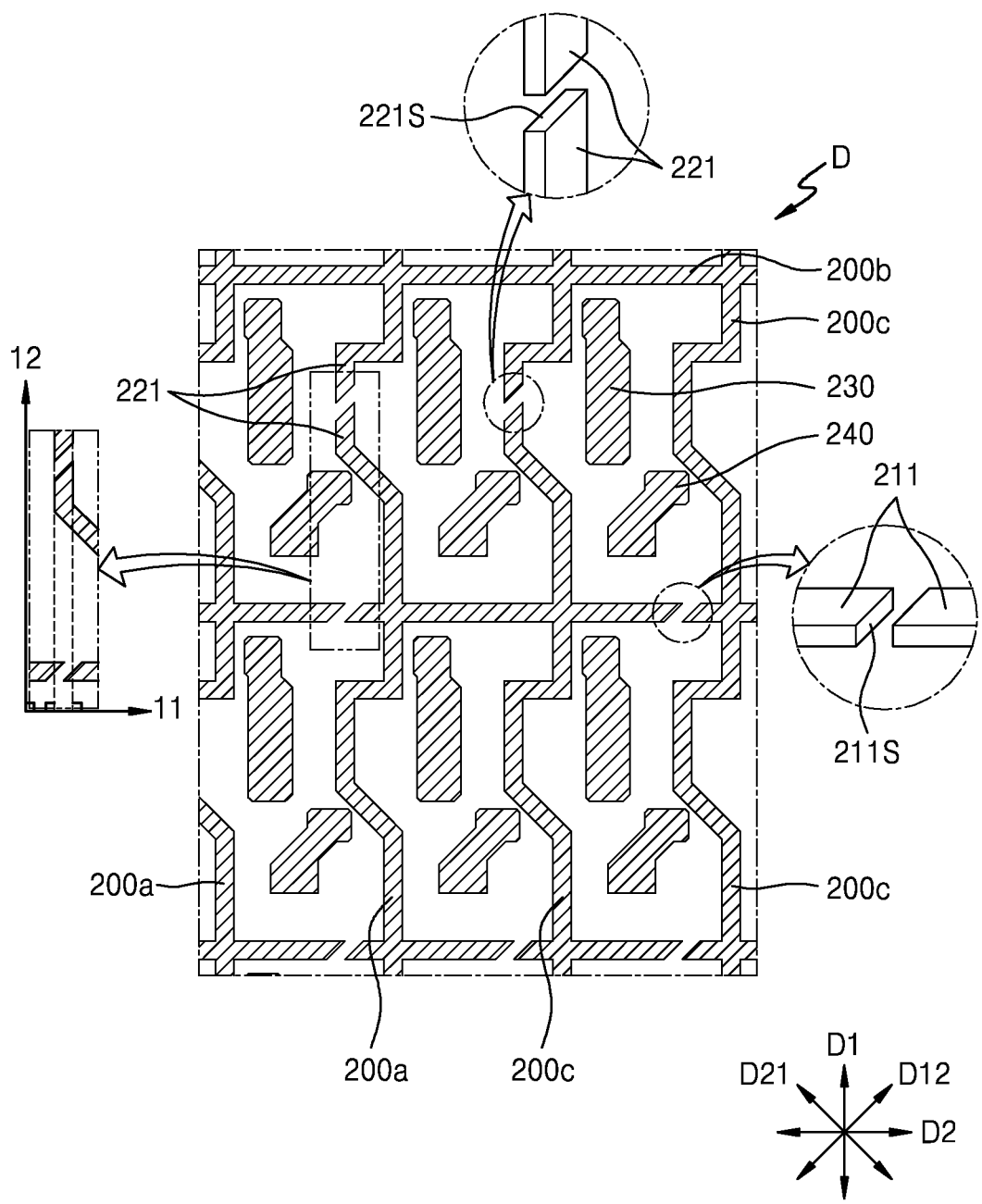
FIG. 13 illustrates a schematic plan view of a first wire in a display apparatus according to an embodiment.

Each of FIGS. 11 to 13 illustrates a schematic plan view of a first wire 200 in a display apparatus according to an embodiment. FIG. 11 is an enlarged plan view of region B of FIG. 1, FIG. 12 is an enlarged plan view of region C of FIG. 1, and FIG. 13 is an enlarged plan view of region D of FIG. 1.

FIGS. 11 to 13 illustrate structures of first wires 200 arranged on a right side of the center line CL, and the illustrated structures may apply analogously to first wires 200 arranged on a left side of the center line CL.

The structures illustrated in FIGS. 11 to 13 are different from those illustrated in FIGS. 6 to 8 in that end edges of first branches 211 and second branches 221 are obliquely oriented in the diagonal direction D12 (between the first direction D1 and the second direction D2) in a plan view of the display panel/apparatus 10. Some description associated with FIGS. 6 to 8 may be applicable to FIGS. 11 to 13 and may not be repeated.

Referring to FIG. 11, first portions 200a of first wires 200 in the first sub-area SS1 may include first branches 211 protruding in the second direction D2. First branches 211 may be aligned in the second direction D2. End edges of the first branches 211 facing each other may be oblique and may extend in the diagonal direction D12. For example, end edges of the first branches 211 may be oriented at approximately 45 degrees relative to the first direction D1. End surfaces 211S of first branches 211 may be misaligned and may be parallel to each other. Locations of gaps between opposite first branches 211 may be substantially aligned in the first direction D1 may be located at regular intervals in the first direction D1 and/or in the second direction D2.

Referring to FIG. 12, second portions 200b of first wires 200 in the second sub-area SS2 extend in the second direction D2, and the second portions 200b may include second branches 221 protruding from bodies of the second portions 200b. End edges of the second branches 221 facing each other may be spaced apart in the first direction D1. End edges of the second branches 221 facing each other may be oblique and may extend in the diagonal direction D12 (between the first direction D1 and the second direction D2) in a plan view of the display panel/apparatus 10. End edges of the second branches 221 may be slanted at a certain angle relative to the lengthwise direction of the second portions 200b. For example, end edges of the second branches 221 may be oriented at approximately 45 degrees relative to the second direction D2. End surfaces 221S of the second branches 221 may be misaligned and may be parallel to each other. Locations of gaps between the second branches 221 may be substantially aligned in the first direction and/or in the second direction D2 and may be located at regular intervals in the first direction D1 and/or the second direction D2.

Referring to FIG. 13, end segments of two first branches 211 protruding toward each other from two immediately adjacent first portions 200a may be spaced apart in the second direction D2. End edges of first branches 211 facing each other may be oblique and may extend in the diagonal direction D12 in a plan view of the display panel/apparatus 10. End surfaces 211S of the first branches 211 may be misaligned and may be parallel to each other.

End segments of two second branches 221 protruding toward each other from two immediately adjacent second portions 200b may be spaced apart in the first direction D1. End edges of second branches 221 facing each other may be oblique and may extend in the diagonal direction D12 in a plan view of the display panel/apparatus 10. End edges of second branches 221 may be oriented at a certain acute angle relative the lengthwise direction of the second portions 200b.

Gaps between end segments of first branches 211 spaced in the second direction D2 may be substantially aligned with gaps between end segments of second branches 221 spaced in the first direction D1 along a first axis 11 extending in the second direction D2. Gaps between first branches 211 may be substantially aligned along a second axis 12 extending in the second direction D2.

As ends of the first branch 211 and the second branch 221 of the first wire 200 have diagonal edges, and gaps between end segments of first branches 211 facing each other are substantially aligned with gaps between end segments of second branches 221 facing each other, reflectance of light reflected (or scattered) from end surfaces of the first branches 211 and end surfaces of the second branches 221 may be substantially uniform; thus, visibility of distinctions between the first sub-area SS1, the second sub-area SS2, and the third sub-area SS3 may be prevented or reduced.

Figure 14:
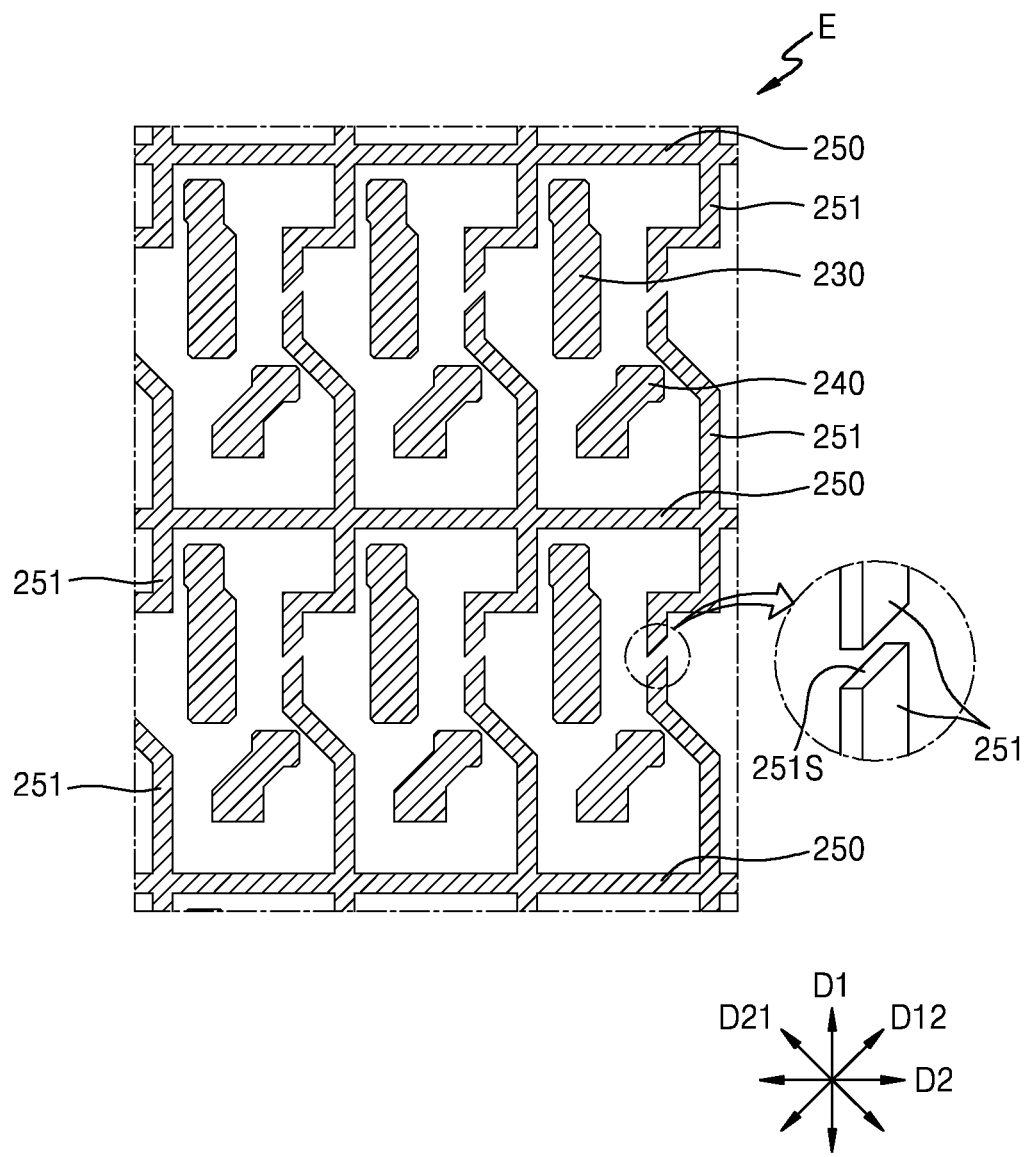
FIG. 14 illustrates a schematic plan view of a fourth wire in a display apparatus according to an embodiment.

FIG. 14 illustrates a schematic plan view of a fourth wire 250 in a display apparatus according to an embodiment. FIG. 14 is an enlarged plan view of region E of FIG. 1.

The structures of FIG. 14 are different from those of FIG. 9 in that end segments of the third branches 251 have diagonal edges extending in the diagonal direction D12 in a plan view of the display apparatus/panel 10. Description of some components/features of FIG. 9 may be applicable to some components/features of FIG. 14 and may not be repeated.

Referring to FIG. 14, end segments of third branches 251 protruding toward each other from two immediately adjacent fourth wires 250 in the second area S2 may be substantially aligned in the first direction D1 and may be spaced apart from each other in the first direction D1 to form a gap. End edges of the third branches 251 facing each other may be oblique and may extend in the diagonal direction D12. End edges of the third branches 251 may be oriented at approximately 45 degrees relative to the second direction D2. End surfaces 251S of the third branches 251 may be misaligned (i.e., not coplanar) and may be parallel to each other. Locations of gaps between third branches 251 may be substantially aligned in the first direction D1 and/or in the second direction D2 and may be located at regular intervals in the first direction D1 and/or in the second direction D2. The fourth wires 250 may be connected to each other in the peripheral area PA. The fourth wires 250 may be integrally formed.

Figure 15:
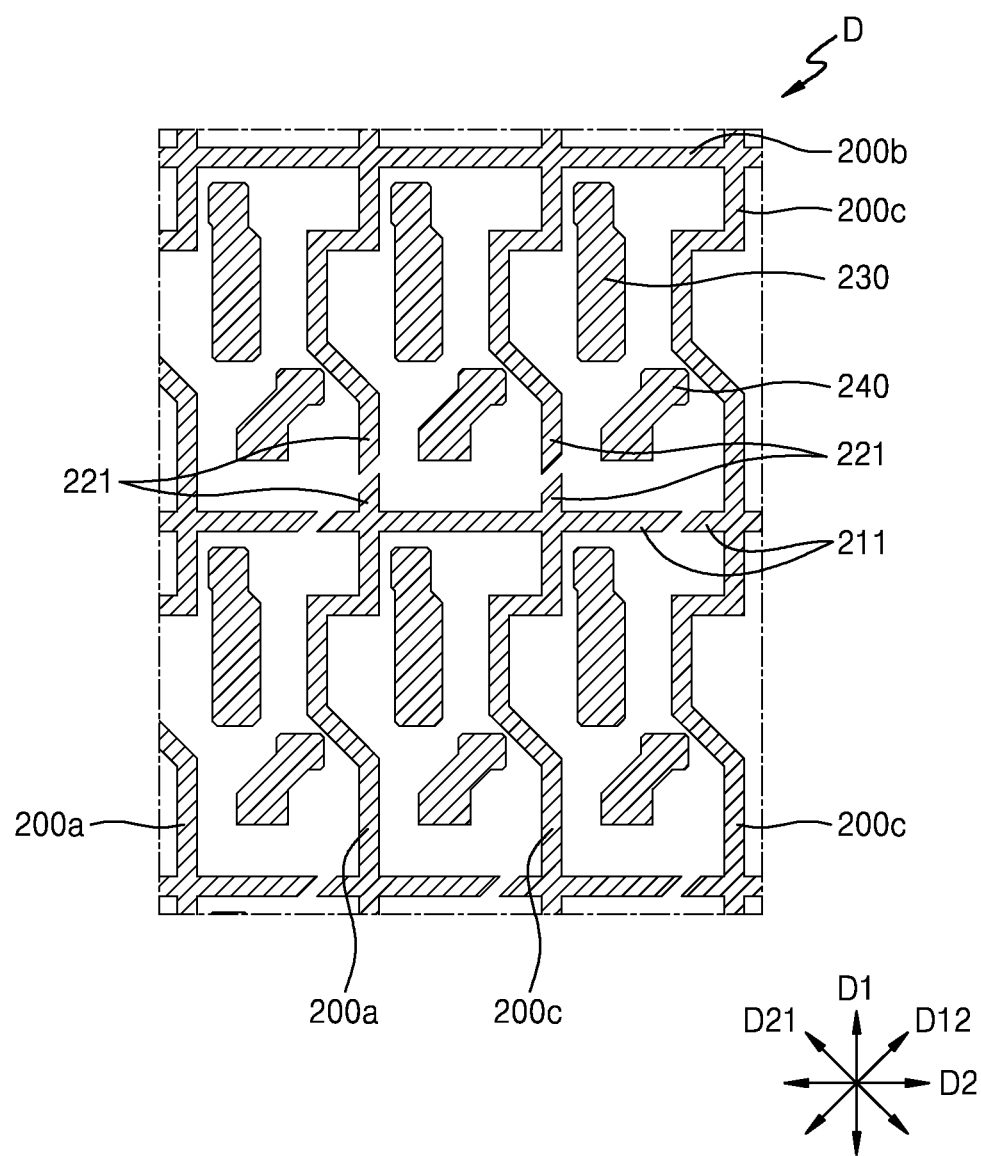
FIG. 15 illustrates a schematic plan view of a first wire in a display apparatus according to an embodiment.

FIG. 15 illustrates a schematic plan view of a first wire 200 in a display apparatus according to an embodiment.

The structures of FIG. 15 are different from those of FIG. 13 in that gaps between end edges of first branches 211 facing each other are positioned closer to gaps between end edges of second branches 221 facing each other in FIG. 15 than in FIG. 13. Description of some components/features of FIG. 13 may be applicable to some components/features of FIG. 15 and may not be repeated.

Referring to FIG. 15, end edges of first branches 211 facing each other may be positioned closer to end edges of second branches 221 facing each other. As a result, a difference in locations where light is reflected (or scattered) in the first sub-area SS1, the second sub-area SS2, and the third sub-area SS3 may be minimized; thus, distinctions between the first sub-area SS1, the second sub-area SS2, and the third sub-area SS3 may be desirably invisible or inconspicuous.

Figure 16A:
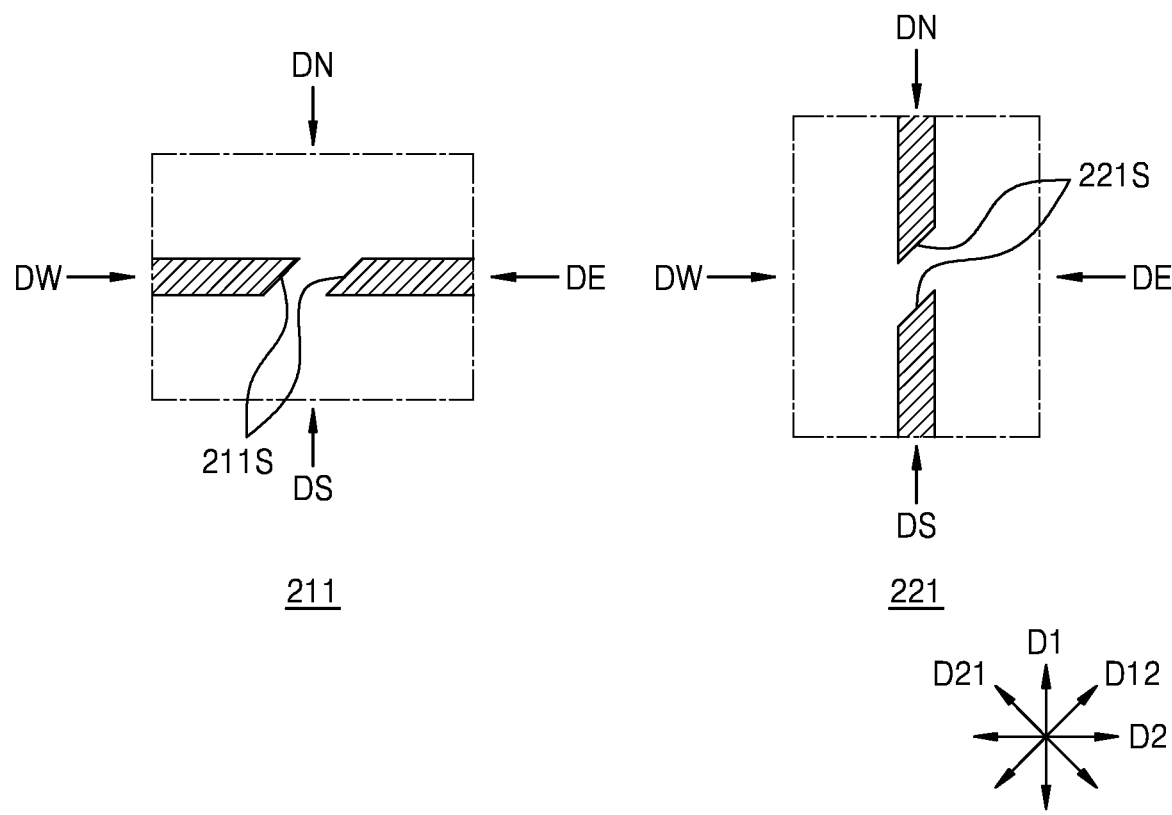
FIG. 16A is a schematic plan view of branches having diagonal/oblique ends/edges according to an embodiment.
Figure 16B:
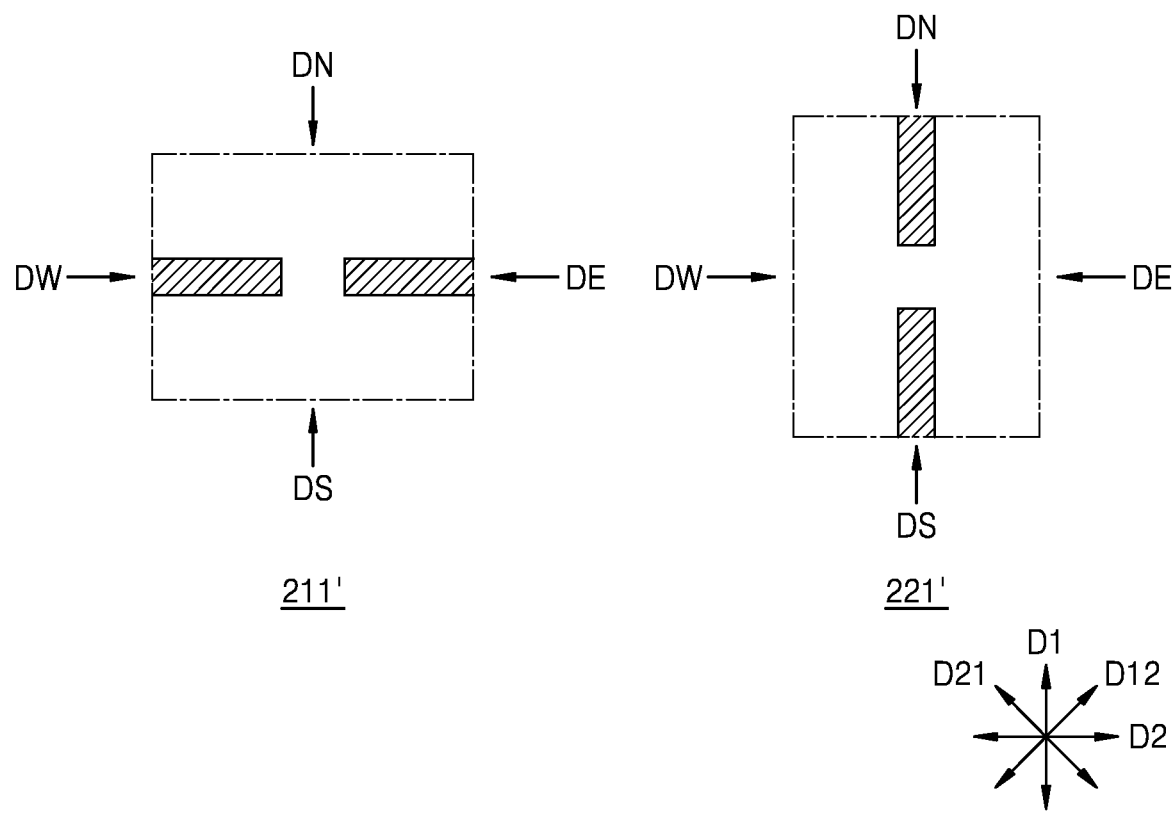
FIG. 16B is a schematic plan view of branches having vertical or horizontal ends according to a comparative example.

FIG. 16A is a plan view of branches having diagonal end edges according to an embodiment. FIG. 16B is a plan view of branches having vertical or horizontal end edges according to a comparative example.

Referring to FIG. 16B, the first branch 211' have vertical end surfaces in the second direction D2, and the second branch 221' have horizontal end surfaces in the first direction D1. When a user looks at the first branch 211' and the second branch 221' at a slant (for example, at a 45-degree angle relative to a main surface of a substrate) in each of the four directions DE, DW, DS, and DN, a significant difference in reflectance may be caused by light reflected (or scattered) from an end surface of the first branch 211' and light reflected (or scattered) from an end surface of the second branch 221'. As a result, the first sub-area SS1, the second sub-area SS2, and the third sub-area SS3 may be undesirably visible.

Referring to FIG. 16A, ends of the first branch 211 and the second branch 221 of the first wire 200 have diagonal edges. When a user looks at the first branch 211 and the second branch 221 at a slant (for example, at a 45-degree angle relative to a main surface of a substrate) in each of the four directions DE, DW, DS, and DN, no significant difference in reflectance may be caused by light reflected (or scattered) from the end surface 211S of the first branch 211 and the end surface 221S of the second branch 221. Advantageously, distinctions between the first sub-area SS1, the second sub-area SS2, and the third sub-area SS3 according to an incidence angle of light may be desirably invisible or inconspicuous.

Figure 17:
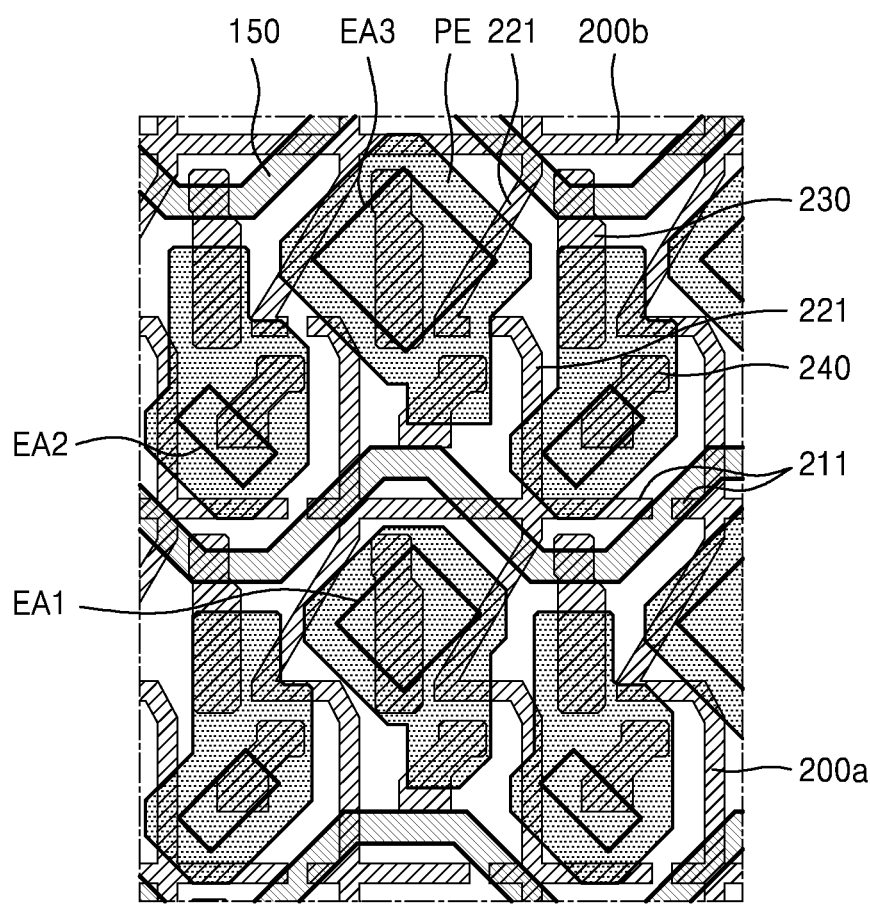
FIG. 17 is a schematic plan view of a portion of a display panel according to an embodiment.
Figure 18:
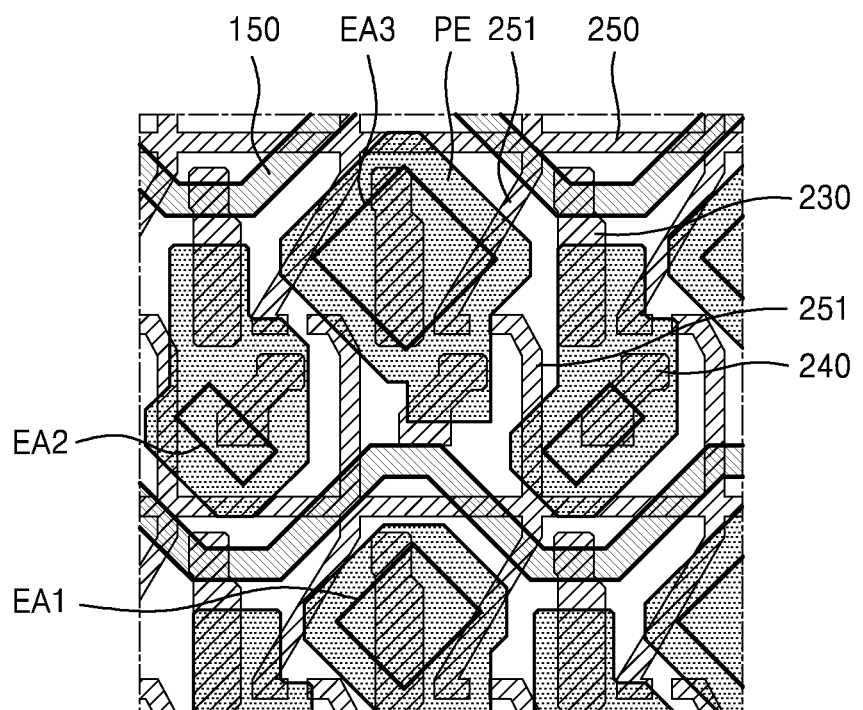
FIG. 18 is a schematic plan view of a portion of a display panel according to an embodiment.
Figure 18:
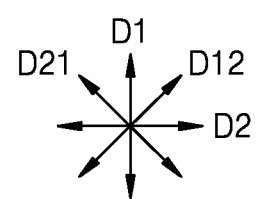
Figure 19:
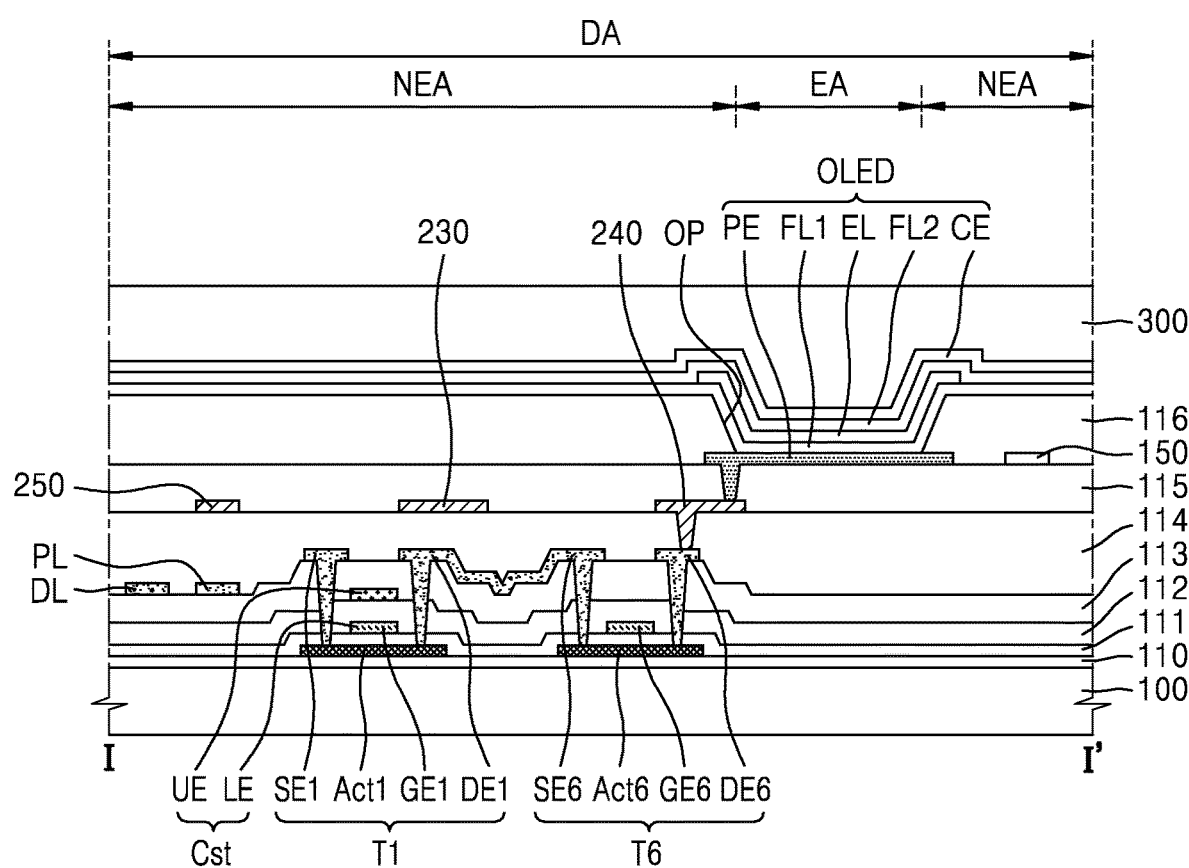
FIG. 19 is a cross-sectional view of a display panel taken along line I-I' of FIG. 1 according to an embodiment.

Each of FIGS. 17 and 18 is a schematic plan view of a portion of a display panel according to an embodiment, and FIG. 19 is a cross-sectional view of the display panel, taken along line I-I' of FIG. 1.

FIG. 17 is a plan view of the arrangement of the first wire 200 and a pixel electrode PE according to an embodiment, FIG. 18 is a plan view of the arrangement of the fourth wire 250 and the pixel electrode PE according to an embodiment, and FIG. 19 illustrates a stacking structures of some components included in a pixel arranged in the display area DA of the substrate 100 and some wires connected to the pixel. FIG. 19 is a cross-sectional view of a portion corresponding to the first thin film transistor T1, the sixth thin film transistor T6, the storage capacitor Cst, and the organic light-emitting diode OLED illustrated in FIG. 5.

The substrate 100 may include a glass material mainly including $SiO_2$ or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multilayer structure including a layer including the above polymer resin and an inorganic layer (not shown). A buffer layer 110 may be arranged on the substrate 100.

The buffer layer 110 may have a single-layer or multilayer structure including an inorganic insulating material such as silicon oxide, silicon nitride, or silicon oxynitride. A barrier layer (not shown) preventing penetration of external air may be further included between the substrate 100 and the buffer layer 110. The buffer layer 110 may be omitted.

The first thin film transistor T1 and the sixth thin film transistor T6 may be arranged on the buffer layer 110. The first thin film transistor T1 may include a semiconductor layer Act1, a gate electrode GE1, a source electrode SE1, and a drain electrode DE1. The sixth thin film transistor T6 may include a semiconductor layer Act6, a gate electrode GE6, a source electrode SE6, and a drain electrode DE6.

The semiconductor layer Act1 of the first thin film transistor T1 and the semiconductor layer Act6 of the sixth thin film transistor T6 may include amorphous silicon, polycrystalline silicon, or an organic semiconductor material. Each of the semiconductor layers Act1 and Act6 may include a source region, a drain region, and a channel region between the source region and the drain region. A first insulating layer 111 may be located on the semiconductor layers Act1 and Act6.

The gate electrode GE1 of the first thin film transistor T1 and the gate electrode GE6 of the sixth thin film transistor T6, for example, may include a single layer or multiple layers including one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu), by taking into account adhesion to an adjacent layer, surface flatness of a layer to be stacked, and processibility. A second insulating layer 112 may be arranged on the gate electrodes GE1 and GE6.

The source electrode SE1 and the drain electrode DE1 of the first thin film transistor T1 and the source electrode SE6 and the drain electrode DE6 of the sixth thin film transistor T6, for example, may include a single layer or multiple layers including one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu). The source electrodes SE1 and SE6 and the drain electrodes DE1 and DE6 may be electrically connected to the source region and the drain region of the semiconductor layers Act1 and Act6, respectively, via a contact hole formed in the first insulating layer 111, the second insulating layer 112, and a third insulating layer 113. The drain electrode DE1 of the first thin film transistor T1 and the source electrode SE6 of the sixth thin film transistor T6 may be connected to each other.

The storage capacitor Cst includes a lower electrode LE and an upper electrode UE overlapping each other with the intervening second insulating layer 112. The storage capacitor Cst may overlap the first thin film transistor T1. FIG. 19 illustrates that the gate electrode GE1 of the first thin film transistor T1 is the lower electrode LE of the storage capacitor Cst. According to another embodiment, the storage capacitor Cst may not overlap the first thin film transistor T1, and the lower electrode LE of the storage capacitor Cst may be an independent component separate from the gate electrode GE1 of the first thin film transistor T1. The upper electrode UE of the storage capacitor Cst may include a single layer or multiple layers including one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu). The storage capacitor Cst may be covered by the third insulating layer 113.

The first insulating layer 111, the second insulating layer 112, and the third insulating layer 113 may include at least one inorganic insulating material selected from the group including silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 111, the second insulating layer 112, and the third insulating layer 113 may include a single layer or multiple layers including the above inorganic insulating material.

Various conductive layers may be further arranged on the third insulating layer 113. For example, the data line DL and the power voltage line PL may be arranged on the third insulating layer 113, that is, on the same layer as the source electrodes SE1 and SE6 and the drain electrodes DE1 and DE6. The data line DL and the power voltage line PL may include aluminum (Al), copper (Cu), titanium (Ti), etc. and may include multiple layers or a single layer. In an embodiment, the data line DL and the power voltage line PL may have a multilayer structure of Ti/Al/Ti.

A fourth insulating layer 114 may be arranged on the data line DL and the power voltage line PL.

The first wire 200 may be arranged on the fourth insulating layer 114. The first wire 200 may include a single film or multilayer film including at least one of aluminum (Al), copper (Cu), titanium (Ti), and an alloy thereof. In an embodiment, the first wire 200 may have a multilayer structure of Ti/Al/Ti. The fourth wire 250 may at least partially overlap the power voltage line PL. The first pattern 230 and the second pattern 240 may be further arranged on the fourth insulating layer 114. The first pattern 230 and the second pattern 240 may include the same material as the fourth wire 250. The second pattern 240 may serve as a connection member configured to electrically connect the sixth thin film transistor T6 and the organic light-emitting diode OLED to each other.

A fifth insulating layer 115 may be arranged on the fourth wire 250, the first pattern 230, and the second pattern 240. The fourth insulating layer 114 and the fifth insulating layer 115, which are planarization insulating layers, may be organic insulating layers. The fourth insulating layer 114 and the fifth insulating layer 115 may include an organic insulating material such as a general commercial polymer such as poly(methyl methacrylate) (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. According to an embodiment, the fourth insulating layer 114 and the fifth insulating layer 115 may include polyimide.

The organic light-emitting diode OLED may be arranged on the fifth insulating layer 115 as a display element. The organic light-emitting diode OLED may include the pixel electrode PE, an emission layer EL, and an opposite electrode CE.

The pixel electrode PE may be arranged on the fifth insulating layer 115 and may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to another embodiment, the pixel electrode PE may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to another embodiment, the pixel electrode PE may further include a film on/under the above reflective film, the film including ITO, IZO, ZnO, or $In_2O_3$. The pixel electrode PE may be electrically connected to the source electrode SE6 or the drain electrode DE6 of the sixth thin film transistor T6 via the second pattern 240 arranged on the fourth insulating layer 114.

A shielding member 150 may be further arranged on the fifth insulating layer 115. The shielding member 150 may extend in the second direction D2 along a portion of the edge of the pixel electrode PE not to overlap the pixel electrode PE in a plan view and may be arranged on an upper side or lower side of each row. The shielding member 150 may extend linearly or zigzag in the second direction D2 according to the arrangement of pixel electrodes PE in the same row. The shielding member 150 may include light-shielding metal. For example, the shielding member 150 may include aluminum (Al), copper (Cu), titanium (Ti), etc. and may include multiple layers or a single layer including the above material. According to an embodiment, the shielding member 150 may have a multilayer structure of Ti/Al/Ti. The shielding member 150 may include the same material as the pixel electrode PE. Shielding members 150 may be spaced apart from each other and may be independently provided for each row. The shielding members 150 may be floated or may be electrically connected to a constant voltage wire (for example, a power voltage line, an initialization voltage line, etc.) to receive a constant voltage.

A sixth insulating layer 116 may be arranged on the fifth insulating layer 115. The sixth insulating layer 116 may have an opening OP corresponding to each pixel and exposing a portion of the pixel electrode PE. The sixth insulating layer 116 may serve as a pixel-defining layer. The sixth insulating layer 116 may include an organic material such as acrylic, benzocyclobutene (BCB), polyimide, or hexamethyldisiloxane (HMDSO). The sixth insulating layer 116 may include an inorganic material. The opening OP of the sixth insulating layer 116 and/or an area exposed by the opening OP (including a portion of the pixel electrode PE) may be defined as an emission area EA. The emission layer EL may be arranged in the emission area EA. Sizes of a first emission area EA1 of a first pixel, a second emission area EA2 of a second pixel, and a third emission area EA3 of a third pixel may be different from one another. A column in which the first emission area EA1 and the third emission area EA3 are alternately repeated in the first direction D1 and a column in which the second emission area EA2 is repeated are repeated in the second direction D2. That is, the first emission area EA1, the second emission area EA2, the third emission area EA3, and the second emission area EA2 are repeated in the second direction D2.

The vicinity of emission areas EA is a non-emission area NEA, and the non-emission area NEA may surround the emission areas EA. The display area DA may include emission areas EA and may include the non-emission area NEA surrounding the emission areas EA.

The emission layer EL may be arranged over the pixel electrode PE exposed by the opening OP of the sixth insulating layer 116. The emission layer EL may include a polymer or low-molecular weight organic material emitting light having a certain color. The emission layer EL may be a red emission layer, a green emission layer, or a blue emission layer. Alternatively, the emission layer EL may have a multilayer structure in which a red emission layer, a green emission layer, and a blue emission layer are stacked to emit white light or may have a single-layer structure including a red emission material, a green emission material, and a blue emission material. According to an embodiment, a first functional layer FL1 under the emission layer EL and/or a second functional layer FL2 on the emission layer EL may be further included. The first functional layer FL1 and/or the second functional layer FL2 may include an integral layer over a pixel electrodes PE or may include a layer patterned to correspond to each of the pixel electrodes PE.

The first functional layer FL1 may include a single layer or multiple players. For example, when the first functional layer FL1 includes a polymer material, the first functional layer FL1 may be a hole transport layer (HTL) having a single-layer structure and may include poly-(3,4)-ethylene-dihydroxy thiophene (PEDOT) or polyaniline (PANI). When the first functional layer FL1 includes a low-molecular weight material, the first functional layer FL1 may include a hole injection layer (HIL) and an HTL.

The second functional layer FL2 may be omitted. For example, when the first functional layer FL1 and an emission layer include a polymer material, the second functional layer FL2 may be formed to improve characteristics of an organic light-emitting diode. The second functional layer FL2 may include a single layer or multiple layers. The second functional layer FL2 may include an electron transport layer (ETL) and/or an electron injection layer (EIL).

The opposite electrode CE faces the pixel electrode PE with the emission layer EL positioned between the electrodes CE and PE. The opposite electrode CE may include a conductive material having a low work function. For example, the opposite electrode CE may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode CE may further include a layer, such as ITO, IZO, ZnO, or $In_2O_3$, on a (semi)transparent layer including the above material. The opposite electrode CE may be arranged over the emission layer EL and the sixth insulating layer 116. The opposite electrode CE may provide a common voltage for a plurality of organic light-emitting diodes OLED in the display area DA and may overlap the pixel electrodes PE.

An encapsulation layer 300 may be arranged on the organic light-emitting diode OLED. The encapsulation layer 300 may include an inorganic encapsulation layer including at least one inorganic material and an organic encapsulation layer including at least one organic material. The organic encapsulation layer may be thicker than the inorganic encapsulation layer. In some embodiments, the encapsulation layer 300 may have a stacked structure of a first inorganic encapsulation layer/an organic encapsulation layer/a second inorganic encapsulation layer. An inorganic material of the first inorganic encapsulation layer and that of the second inorganic encapsulation layer may be the same as or different from each other. The first inorganic encapsulation layer may have a two-layer structure including inorganic materials different from each other. A capping layer covering the opposite electrode CE may be further arranged between the opposite electrode CE of the organic light-emitting diode OLED and the encapsulation layer 300. In another embodiment, a sealing substrate (not shown) may be arranged on the organic light-emitting diode OLED to face the substrate 100 and may be bonded to the substrate 100 at the outside of the display area DA by a sealing member such as a sealant or a frit.

According to embodiments, in a display area of a display apparatus, spacing directions for opposite ends of first branches 211 of first wires 200 may be aligned with spacing directions for opposite ends of second branches 221 of first wires 200. End edges of second branches 221 may be aligned with or parallel to end edges of first branches 211. Gaps between first branches 211 may be substantially aligned with gaps between second branches 221. Accordingly, reflection characteristics of light may be substantially uniform at the display area of the display apparatus. Advantageously, the first wires 200 may be invisible or sufficiently inconspicuous to the user of the display apparatus.

According to embodiments, a peripheral area of the display apparatus may be minimized.

Example embodiments described above should be considered in an illustrative sense and not for purposes of limitation. Descriptions of features associated with each embodiment may be applicable to one or more other embodiments. Various changes in form and details may be made in the example embodiments without departing from the scope defined by the following claims.

What is claimed is:

1. A display apparatus comprising:
a substrate comprising a display area and a peripheral area outside the display area;
first data lines extending in a first direction and arranged on the display area;
first wires arranged on the display area; and
a driving circuit arranged on the peripheral area and electrically connected through the first wires to the first data lines,
wherein branches protrude from bodies of the first wires,
wherein two branches among the branches protrude toward each other, and
wherein end edges of the two branches are spaced apart in a second direction different from the first direction.

2. The display apparatus of claim 1, wherein first sections of the first wires are connected through second sections of the first wires, respectively, to third sections of the first wires, respectively, and wherein the second sections of the first wires extend in the second direction, are not aligned with the first sections of the first wires, and are not aligned with the third sections of the first wires.

3. The display apparatus of claim 2, wherein first branches protrude from the first sections of the first wires and from the third sections of the first wires, and wherein second branches protrude from the second sections of the first wires.

4. The display apparatus of claim 3, wherein two first branches among the first branches protrude toward each other, and wherein end edges of the two first branches are spaced apart in the second direction.

5. The display apparatus of claim 4, wherein end edges of two second branches among the second branches are spaced apart in the second direction.

6. The display apparatus of claim 5, wherein the end edges of the two first branches are respectively aligned with the end edges of the two second branches.

7. The display apparatus of claim 1, further comprising:
second data lines arranged on the display area;
second wires arranged on the peripheral area and electrically isolated from the second data lines; and
third wires arranged on the peripheral area and electrically isolated from the second wires.

8. The display apparatus of claim 7, wherein the second wires are electrically connected through the first wires, respectively, to the first data lines, respectively.

9. The display apparatus of claim 8, further comprising an insulating layer, wherein a face of the insulating layer directly contacts the first wires and is spaced from the first data lines.

10. The display apparatus of claim 7, wherein the third wires are electrically connected to the second data lines, respectively.

11. The display apparatus of claim 10, further comprising an insulating layer, wherein a face of the insulating layer directly contacts the third wires and is spaced from the second data lines.

12. The display apparatus of claim 1, further comprising fourth wires arranged on the display area, wherein the fourth wires are electrically isolated from the first wires.

13. The display apparatus of claim 12, wherein third branches protrude from bodies of the fourth wires,
wherein end edges of two third branches among the third branches are spaced apart in the second direction.

14. A display apparatus comprising:
a substrate comprising a display area and a peripheral area outside the display area;
first data lines extending in a first direction and arranged on the display area;
first wires arranged on the display area; and
a driving circuit arranged on the peripheral area and electrically connected through the first wires to the first data lines,
wherein branches protrude from bodies of the first wires,
wherein end edges of the branches are oblique relative to the first direction.

15. The display apparatus of claim 14, wherein the end edges of the branches are parallel to each other.

16. The display apparatus of claim 14, wherein first sections of the first wires are connected through second sections of the first wires, respectively, to third sections of the first wires, respectively, and wherein the second sections of the first wires extend in a second direction different from the first direction, are not aligned with the first sections of the first wires, and are not aligned with the third sections of the first wires.

17. The display apparatus of claim 16, wherein first branches protrude from the first sections of the first wires and from the third sections of the first wires, wherein second branches protrude from the second sections of the first wires, wherein end edges of the first branches are oblique relative to the first direction, and wherein end edges of the second branches are oblique relative to the first direction.

18. The display apparatus of claim 17, wherein two first branches among the first branches protrude toward each other, and wherein end edges of the two first branches are spaced apart in the second direction.

19. The display apparatus of claim 18, wherein two second branches among the second branches protrude toward each other, and wherein end edges of the two second branches are spaced apart in the first direction.

20. The display apparatus of claim 19, wherein a gap between the end edges of the two first branches is aligned with a gap between the end edges of the two second branches in the first direction.

* * * * *